(12) United States Patent
Wachi et al.

(10) Patent No.: US 8,018,292 B2
(45) Date of Patent: Sep. 13, 2011

(54) OSCILLATOR AND COMMUNICATION SYSTEM USING THE SAME

(75) Inventors: Yusuke Wachi, Okegawa (JP);
Toshiyuki Nagasaku, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 69 days.

(21) Appl. No.: 12/222,575

(22) Filed: Aug. 12, 2008

(65) Prior Publication Data
US 2009/0072920 A1    Mar. 19, 2009

(30) Foreign Application Priority Data
Sep. 10, 2007    (JP) .................................. 2007-233853

(51) Int. Cl.
*H03K 3/282* (2006.01)
(52) U.S. Cl. .......... 331/117 R; 331/108 R; 331/116 FE; 331/117 FE; 331/167; 331/154
(58) Field of Classification Search ............... 331/107 A, 331/108 R, 116 FE, 116 R, 117 R, 154, 158, 331/167, 117 FE
See application file for complete search history.

(56) References Cited

U.S. PATENT DOCUMENTS

| | | | | |
|---|---|---|---|---|
| 5,418,497 | A * | 5/1995 | Martin | 331/48 |
| 6,411,170 | B2 * | 6/2002 | Hino | 331/117 R |
| 6,982,605 | B2 * | 1/2006 | Mondal et al. | 331/117 R |
| 7,245,190 | B2 * | 7/2007 | Copani et al. | 331/117 R |
| 7,610,022 | B1 * | 10/2009 | Teo et al. | 455/73 |
| 2007/0021088 | A1 * | 1/2007 | Sheng-Fuh et al. | 455/319 |
| 2007/0164828 | A1 * | 7/2007 | Uozumi et al. | 331/16 |
| 2007/0290930 | A1 * | 12/2007 | Krishnaswamy et al. | 343/700 MS |
| 2008/0129399 | A1 * | 6/2008 | Jang et al. | 331/117 FE |
| 2008/0174378 | A1 * | 7/2008 | Cusmai et al. | 331/167 |

FOREIGN PATENT DOCUMENTS

| | | |
|---|---|---|
| EP | 0 909 018 A1 | 4/1999 |
| EP | 0 909 018 B1 | 4/1999 |
| JP | 2000-307423 | 4/1999 |
| JP | 2004-260301 | 2/2003 |
| JP | 2004-23762 | 1/2004 |
| WO | WO 2004/036735 A1 | 4/2004 |

OTHER PUBLICATIONS

Leeson, D.B., "A Simple Model of Feedback Oscillator Noise Spectrum", Proceedings of the IEEE, vol. 54, No. 2, Feb. 1966, pp. 329-330.

(Continued)

*Primary Examiner* — Arnold Kinkead
*Assistant Examiner* — Richard Tan
(74) *Attorney, Agent, or Firm* — Stites & Harbison PLLC; Juan Carlos A. Marquez, Esq.

(57) ABSTRACT

A transfer impedance from input terminals of a resonator to output terminals of the resonator is larger than a driving-point impedance of the input terminals of the resonator at an oscillation frequency. The input terminals of the resonator are connected with the drain terminals of transistors Q1 and Q2 that are outputs of a differential amplifier, and the output terminals of the resonator are connected with gate terminals of the transistors Q1 and Q2 that are inputs of the differential amplifier. With this configuration, during the oscillating operation, the oscillation voltage amplitude of the gate terminals of the transistors Q1 and Q2 becomes larger than the oscillation voltage amplitude of the drain terminals. Therefore, it is possible to prevent the transistor, which is oscillating, from operating in a triode region, and suppress the deterioration of the Q-factor.

16 Claims, 25 Drawing Sheets

OTHER PUBLICATIONS

Hajimiri, Ali, et al., "A General Theory of Phase Noise in Electrical Oscillators", IEEE Journal of Solid-State Circuits, vol. 33, No. 2, Feb. 1998, pp. 179-194.

Huang, Ping-Chen, et al., "A 131 GHz Push-push VCO in 90-nm CMOS Technology", IEEE Radio Frequency Integrated Circuits Symposium, 2005, pp. 613-616.

Song, Taeksang, et al., "A 5GHz Transformer-Coupled CMOS VCO Using Bias-Level Shifting Technique", IEEE Radio Frequency Integrated Circuits Symposium, 2004, pp. 127-130.

Office Action from European Patent Office for Application 08014629.3-2215/2034609 mailed Aug. 9, 2010.

\* cited by examiner

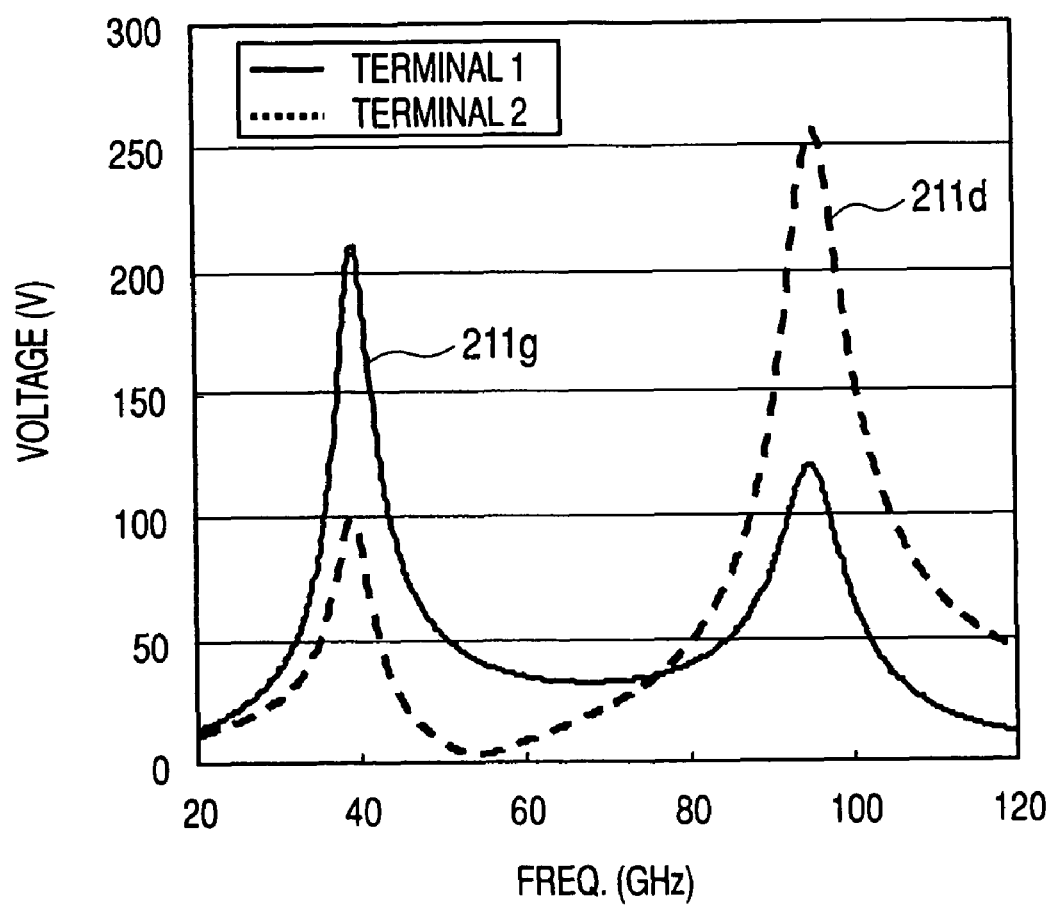

OSCILLATOR AND COMMUNICATION SYSTEM USING THE SAME

CLAIM OF PRIORITY

The present application claims priority from Japanese Patent Application JP 2007-233853 filed on Sep. 10, 2007, the content of which is hereby incorporated by reference into this application.

FIELD OF THE INVENTION

The present invention relates to an oscillator and a communication system using the same, and particularly, to an LC cross-coupled oscillator that is suitable for generating a carrier wave signal of a communication system and a radar system of a resonator microwave or a millimeter wave frequency band, and a communication system using the same.

BACKGROUND OF THE INVENTION

An example of the LC cross-coupled oscillator that includes a resonator configured by an inductor and a capacitor is disclosed in JP-A-2004-260301. Further, in D. B. Leeson, "A Simple Model of Feedback Oscillator Noise Spectrum", Proc. IEEE, vol. 54, pp. no. 2, 329-330, February 1966, a phase noise power of an oscillator in a small signal model is disclosed. Further, in A. Hajimiri and T. H. Lee, "A general theory of phase noise in electrical oscillators" IEEE J. Solid-State Circuits, vol. 33, pp. 179-194, February 1998, a phase noise power in the large signal model is disclosed. Furthermore, an example of an oscillator in which the tail current source is removed from an LC cross-coupled oscillator and a common ground point of a differential amplifier is directly connected with a circuit ground is disclosed in Ping-Chen Huang, "A 131 GHz Push-push VCO in 90-nm CMOS Technology", IEEE RFIC, 2005. An example of an LC cross-coupled oscillator that does not have a tail current source is described in T. Song, "A 5 GHz Transformer-Coupled CMOS VCO Using Bias-Level Shifting Technique", IEEE RFIC 2004.

SUMMARY OF THE INVENTION

The phase noise is an important indicator that represents the performance of an oscillator. The output spectrum of an ideal oscillator is exemplified by a line spectrum, but the spectrum of an actual oscillator has a skirt characteristic when the oscillation frequency extends at both sides. The phase noise is defined as the ratio of an oscillation output level of the oscillation frequency and a noise level of a frequency that is different from the oscillation frequency by a predetermined frequency. The characteristic of the phase noise is regarded as the most important characteristic because it is required to maintain the quality of the communication system and transmit information without an error.

According to the above-mentioned D. B. Leeson, the phase noise power of an oscillator in the small signal model is represented by the following Equation 1.

$$S(\Delta f) \approx 10\text{Log}\left[1 + \frac{1}{\Delta f_2}\left(\frac{f_0}{2Q}\right)^2 + \frac{fc}{\Delta f^3}\left(\frac{f_0}{2Q}\right)^3\right] + 10\text{Log}\frac{F_V KT}{P_0} \quad (1)$$

Here, fc, $\Delta f$, Q, $P_0$, and Fv indicate an oscillation frequency, an offset frequency from fc, a quality factor of a resonator, an oscillation power, and a noise factor of the oscillator, respectively. The noise factor represents a level of a noise component that is generated in the oscillator, and is caused by a transistor or a resistive component that generates a thermal noise. Basically, Fv depends on the number of transistors and the number of resistors in a circuit. In the case of an oscillator mounted in an integrated circuit, a channel thermal noise that is generated from the transistor serves as the main factor among the noise components that are involved in Fv.

On the other hand, according to the above-mentioned A. Hajimiri and T. H. Lee, the phase noise power in the large signal model is represented by Equation 2.

$$S(\Delta\omega) = 10\text{Log}\left[\frac{\overline{i_n^2}\sum_{n=0}^{\infty}c_n^2}{4q_{max}^2\Delta\omega^2}\right] \quad (n \text{ is an integer}) \quad (2)$$

Here, $q_{max}$, $i_n$, and $C_n$ indicate the amount of maximum stored charges at an oscillation node, the amount of injected noise current, and a Fourier coefficient when the oscillation waveform is Fourier series expanded, respectively.

The $q_{max}$ and $i_n$ are parameters that relate to Po and Fv in the above-mentioned Equation 1. As $q_{max}$ becomes larger and $i_n$ becomes smaller, the phase noise is improved. Here, $C_n$ is a coefficient that represents a distortion component of the oscillation waveform. In the case of an ideal sine wave without distortion, if n>1, $C_n$ is 0. Further, in the case of an actual electronic oscillator, if n>1, $C_n$ is not 0 by the influence of the nonlinearity of the transistor. It is apparent from Equation 2 that when $C_n$ is small, that is, the distortion of the oscillation waveform is small, the phase noise is improved.

According to Equations 1 and 2, the following four factors are important to reduce the phase noise: (1) increase in oscillation amplitude, (2) increase in Q of a resonator, (3) reduction of the noise factor caused by the thermal noise of a transistor and a resistor, and (4) lowering of the distortion of an oscillation waveform.

FIG. 18 is a circuit diagram showing an example of a LC cross-coupled oscillator according to the related art. This oscillator includes a differential amplifier circuit that includes Q1 and Q2, and a load that includes an LC resonator 1. An output signal of the differential amplifier circuit is extracted from a drain terminal, and a frequency of the output signal is selected and amplified by an LC resonator 1 that has a resonant frequency adjusted to a desired oscillation frequency. Thereafter, the output signal is input to a gate terminal of another transistor. The oscillation operation may be generated and maintained with a desired frequency by repeating this operation. A tail current source I1 that is connected with a common ground part of the differential amplifier circuit suppresses the amplitude of the oscillation signal to a constant value during the oscillating operation and reduces the distortion of the oscillation waveform.

On the other hand, FIG. 19 shows an oscillator that excludes the tail current source from the LC cross-coupled oscillator of FIG. 18, and directly connects the common ground point of the differential amplifier with a circuit ground. When the oscillator is configured as above, since the voltage drop does not occur in the tail current source, the amplitude becomes larger than that of the oscillator shown in FIG. 18. Moreover, since the transistors and the resistors that configure the tail current source are excluded, the noise factor of the oscillator can be lowered. As a result, two of the above-described four factors, that is, (1) increase in oscillation amplitude and (3) reduction of the phase noise according to the reduction of the noise source are effective in reducing the phase noise.

However, two problems exist in the oscillator shown in FIG. 19. These problems will be described with reference to FIG. 20. FIG. 20 shows typically a gate-drain voltage and a drain current during an oscillation operation of the oscillator. As shown in FIG. 20, the dotted line 10 indicates the boundary between a triode region and a saturation region of a transistor and the condition is shown by Equation 3.

$$V_{DS} \geq V_{GS} - V_{TH} \tag{3}$$

In the saturation region, the drain current is not effected by the drain-source voltage. Therefore, the output resistance in the saturation operating region is high. On the other hand, in the triode region, the drain current is almost linearly proportional to the drain-source voltage. Therefore, the output resistance in the triode region is low. The solid line 11 in FIG. 20 indicates the characteristics of a drain voltage and a drain current: line 11(a) indicates that $V_{gs}$ is small, line 11(b) indicates that $V_{gs}$ is medium, and line 11(c) indicates that $V_{gs}$ is large.

Reference numeral 40 in FIG. 20 denotes the characteristic of the gate-drain voltage and a drain current of a transistor during the oscillation operation of the cross-coupled oscillator shown in FIG. 18. The oscillator shown in FIG. 18 has a small oscillation amplitude as shown by the characteristic 40 due to the constant current of the tail current source I1 and the amount of voltage drop of the tail current, as described above. As a result, the oscillation waveform has low distortion. In the meantime, since the oscillator shown in FIG. 19 does not include the tail current source I1, the gate-source voltage that controls the drain current serves as the magnitude of the oscillation amplitude voltage. Further, as shown by the characteristics 30, the gate-source voltage does not reach the saturation region of an MOS transistor, but enters the triode region. FIG. 21 shows transient waveforms of a gate terminal VG and a drain terminal VD and a transient waveform of a drain current ID of the oscillator shown in FIG. 19. The output resistance of the transistor can be represented by the amount of changed drain current according to the change of the output voltage as described above. The smaller the amount of change is, the larger the output resistance is. As known from the drain voltage and drain current characteristics 11 shown in FIG. 20, the output resistance of the MOS transistor in the triode region (linear operation region of FIG. 21) remarkably decreases as compared with the output resistance in the saturation region. In the LC cross-coupled oscillator, the output resistance of the transistor is connected with a resonator 1 in parallel. Generally, the output resistance in the triode region is smaller than an impedance of the resonator 1 at a resonant frequency, that is, the oscillation frequency. Therefore, the resonant impedance is lowered to deteriorate a Q-factor. Further, the periodic change in impedance causes the distortion of the oscillation waveform. As a result, the oscillator of FIG. 19 can obtain the effects, such as (1) increase in oscillation amplitude and (3) reduction of the noise factor Fv to improve the phase noise, but problems, such as (2) increase in Q of a resonator and (4) distortion of an oscillation waveform also remain. Therefore, the oscillator is ineffective for reducing the phase noise.

FIG. 22 shows an oscillator in which the tail current source I1 of the LC cross-coupled oscillator shown in FIG. 18 is disposed at a power supply voltage VDD side. In this oscillator, even though a common source terminal of a differential pair is directly connected to a ground, a constant current is supplied from a top current source. Therefore, the operation principle has the same problems as the oscillator shown in FIG. 18.

FIG. 23 is an oscillator that has a DC component cut from a drain output terminal of a transistor by a capacitor C3, input to a gate terminal of another transistor, and then bias-shifted to the gate terminal with a direct current that is lower than a direct current of the drain output terminal in the LC cross-coupled oscillator that does not have the tail current source shown in FIG. 19. Further, a signal attenuation circuit 7 may be inserted between the capacitor C3 and the gate terminal. An example of the above described oscillator is disclosed in T. Song.

According to the example of FIG. 23, by lowering a bias voltage of the gate terminal, as shown by the characteristics 40 shown in FIG. 20, even though the amplitude voltage of the drain terminal becomes larger, the condition of the saturation region represented by Equation 3 can be satisfied, which makes it possible to prevent the transistor from operating in the triode region of the transistor.

The above-described LC cross-coupled oscillator shown in FIG. 23 is connected from the drain terminal to which a resonator is connected, to a gate of another transistor through a capacitive element C3 or an attenuator 7. Therefore, the oscillation amplitude in the gate terminal becomes smaller than the oscillation amplitude of the drain terminal.

However, according to the cross-coupled amplifier of FIG. 23 in which the amplitude of the gate terminal is small (that is, the gate-source voltage is small), a tail current source I1 is excluded, and the distortion of the output amplitude is lowered without deteriorating the Q-factor, which improves the phase noise. However, there is still problem in that the phase noise effect followed by the increase in the amplitude can not be obtained. That is, the oscillator shown in FIG. 23 can solves two among the factors to improve the phase noise, that is, (3) reduction of the noise factor Fv and (4) lowering of the distortion of an oscillator waveform, but the trade-off relationship that (1) the oscillation amplitude is decreased may be caused.

An object of the invention is to provide an LC cross-coupled oscillator in which a common source terminal of a differential pair is directly connected to a ground, which is capable of increasing the oscillation amplitude of the gate terminal and lowering the distortion of the oscillation amplitude without deteriorating the Q-factor of the resonator, which results in increasing the oscillation amplitude, reducing the noise factor Fv, and reducing the distortion of the oscillation waveform. Thereby, it enables to provide an oscillator having an excellent low phase noise characteristic and a communication system using the same.

According to an exemplary embodiment of the invention, an oscillator comprising: a differential amplifier that includes a pair of transistors commonly grounded; and a pair of resonators each of which includes a first terminal, a second terminal, and a third terminal, wherein each of the resonators is configured by a feedback loop in which the first terminal is connected to an output terminal of one of the transistors of the differential amplifier, and the second terminal is connected to an input terminal of the other transistor of the differential amplifier, and wherein, in each of the resonators, a transfer impedance from the first terminal connected to the output terminal of the one transistor to the second terminal connected to the input terminal of the other transistor is larger than a driving-point impedance of the first terminal at an oscillation frequency.

According to the exemplary embodiment of the invention, it is possible to simultaneously satisfy the increase in the oscillation amplitude, the removal of the tail current source (or top current source) that serves as the noise source, and reduction of the distortion of the oscillation waveform without deteriorating the Q-factor which cause the trade-off relationship with the related art, thereby achieving an oscillator that has a low phase noise characteristic and a communication system using the same.

BRIEF DESCRIPTION OF THE DRAWINGS

FIG. 5C is a diagram showing a frequency characteristic of the resonator shown in FIG. 5A;

DETAILED DESCRIPTION OF THE PREFERRED EMBODIMENTS

Hereafter, exemplary embodiments of the present invention will be described in detail with reference to the accompanying drawings.

First Embodiment

Figure 1:
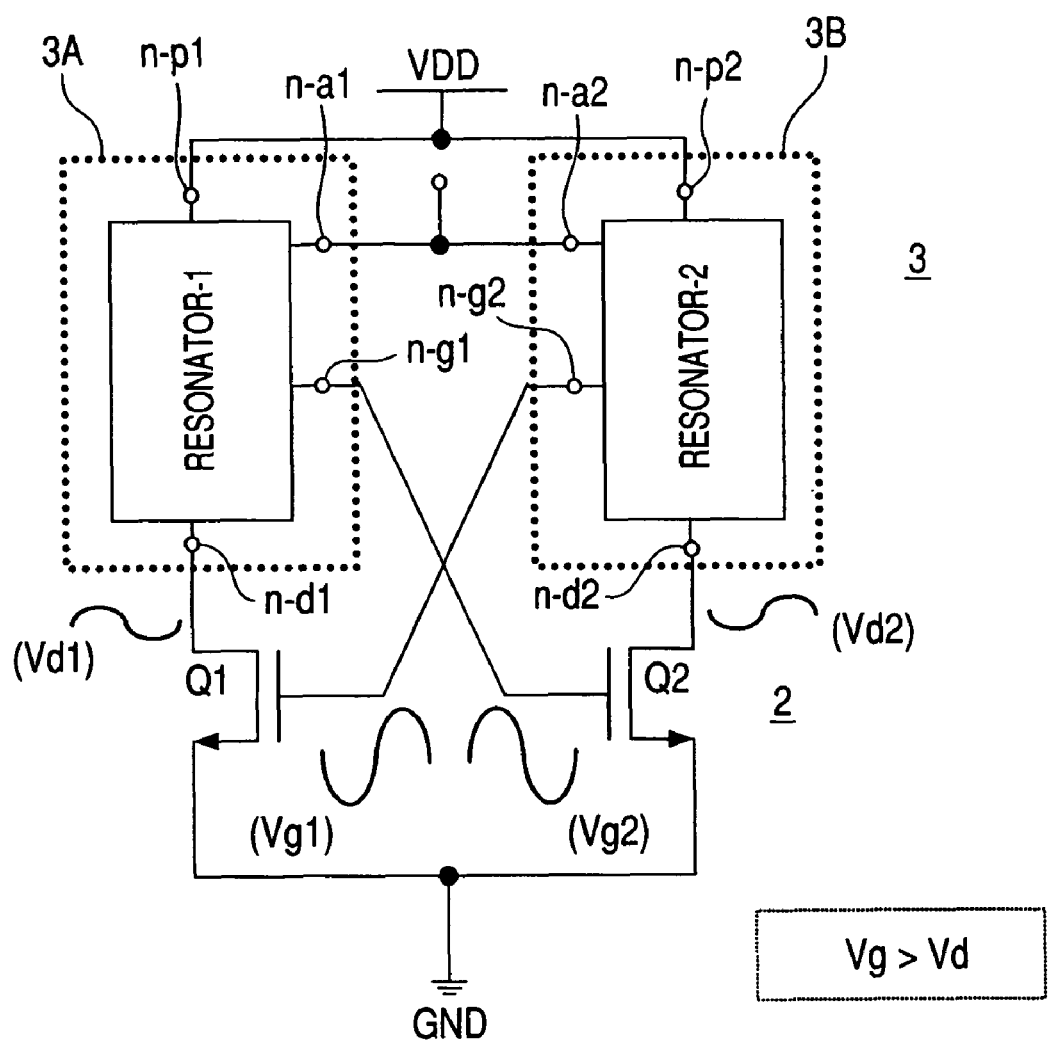
FIG. 1 is a circuit diagram showing a circuit configuration of an oscillator according to a first embodiment of the present invention.

FIG. 1 is a circuit diagram showing a circuit configuration of an oscillator according to a first embodiment of the invention. The oscillator according to the first embodiment includes a differential amplifier 2 that has two transistors Q1 and Q2 commonly grounded and a pair of resonators 3A and 3B. Each of the resonators 3A and 3B includes a plurality of capacitors (C) and an plurality of inductors (L), respectively. Each resonator 3A and 3B has at least three terminals, that is, a first terminal, a second terminal, and a third terminal. The first terminals are input terminals n-d1 and n-d2 to input an output current from the differential amplifier 2. The second terminals are output terminals n-g1 and n-g2 to drive the differential amplifier 2 using a voltage. Further, the third terminals are connected to a power supply of the oscillator, and include power supply direct connection terminals n-p1 and n-p2 that directly connect at least some of the elements of the differential amplifier 2 to a power supply VDD and power supply connections n-a1 and n-a2 that connect other elements of the differential amplifier 2 to the power supply or an AC ground.

The oscillator of the first embodiment connects an output of one of the transistors (for example, Q1) that composes the differential amplifier 2 to an input terminal (for example, n-d1) of one of the resonators (for example, 3A), and input an output terminal (for example, n-g1) of the resonator to another transistor (for example, Q2) of the differential amplifier, which refers to a feedback loop.

When the transistors Q1 and Q2, which compose the differential amplifier, are embodied by a CMOS process, the output of the differential amplifier 2 serves as a drain terminal, an input serves as a gate terminal, and a common ground point serves as a source terminal.

The common source terminal of the differential amplifier 2, which composes the oscillator is directly connected with the ground. The power supply direct connection terminals n-p1 and n-p2 are directly connected to the power supply VDD without interposing the tail current source therebetween. Even though the power supply direct connection terminals n-p1 and n-p2 are directly connected to the power supply, the terminals do not need to be directly connected to the power supply VDD, and may be connected to the power supply with other component therebetween. Otherwise, the terminals may be connected to an AC ground point to be supplied with a voltage that is different from the power supply VDD.

The oscillator according to the first embodiment is configured such that a transfer impedance from the input terminals n-d1 and n-d2 of the resonator 3 to the output terminals n-g1 and n-g2 of the resonator 3 (the pair of the resonators 3A and 3B) is larger than a driving-point impedance of the input terminals n-d1 and n-d2 at an oscillation frequency. In this case, the input terminals n-d1 and n-d2 of the resonator are connected with the drain terminals of the transistors Q1 and Q2 that serve as an output of the differential amplifier 2, and the output terminals n-g1 and n-g2 of the resonator 3 are connected with the inputs of differential amplifier 2 (gate terminals of the transistors Q1 and Q2). Therefore, during the oscillating operation, the oscillation voltage amplitude Vg of the gate terminals of the transistors Q1 and Q2 becomes larger, while the oscillation voltage amplitude Vd of the drain terminals is small. Moreover, in order to remove the tail current source (or top current source) that serves as a noise source, as a connection terminal of the resonator that is connected to the power supply, the power supply direct connection terminals n-p1 and n-p2, which are directly connected to the power supply VDD without interposing the tail current source therebetween, are provided.

With the above-described characteristics, in the oscillator according to the present invention, the oscillation voltage amplitude of the gate terminals of the transistors Q1 and Q2 is larger than the oscillation voltage amplitude of the drain terminals during the oscillating operation.

Therefore, according to the oscillator having the above characteristics, the gate terminal voltage amplitude of the transistors Q1 and Q2 that configures the differential amplifier can become larger than the drain terminal voltage amplitude at a predetermined oscillation frequency. As a result, it is possible to prevent the transistor, which is oscillating, from operating in a triode region, and deterioration of the Q-factor. Further, the gate terminal voltage amplitude can be maintained to be equal with that of the LC cross-coupled oscillator that does not have the tail current source. As described above, the oscillator according to the first embodiment can obtain an excellent phase noise characteristic.

Figure 2:
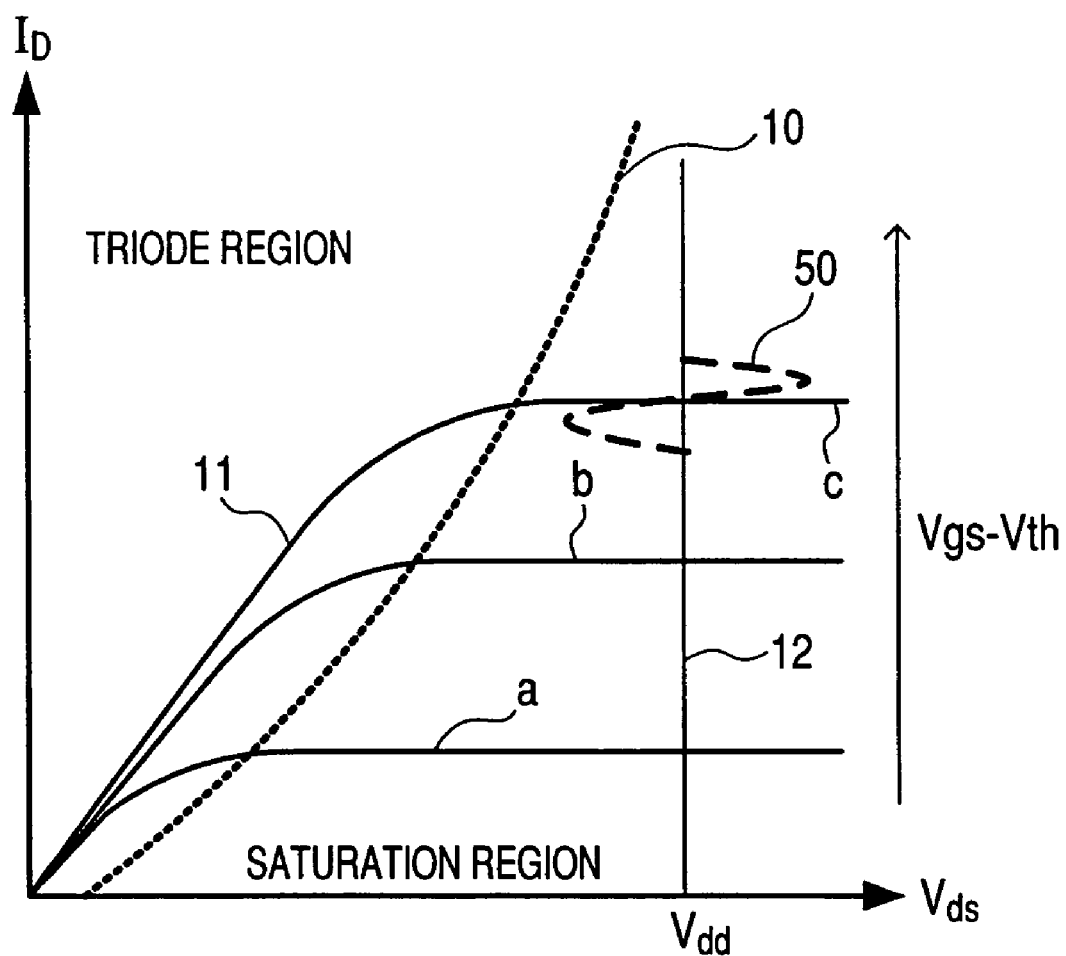
FIG. 2 is a diagram showing the correspondence between a gate-drain voltage and a drain current of the oscillator according to the first embodiment of the invention.

According to the oscillator of the first embodiment, it is further possible to decrease the triode region operation during the oscillating operation of the transistor that composes the differential circuit according to the above-mentioned related art. This principle will be described with reference to FIG. 2. A characteristic 50 of FIG. 2 shows a waveform and a magnitude of a voltage of the drain terminal of the oscillator according to the first embodiment. The oscillator according to the first embodiment makes it possible to reduce the triode region operating time of the transistor without adjusting the DC voltage level of the gate terminal by reducing the voltage amplitude of the drain terminal.

By following this operating principle, it is possible to suppress the deterioration of the Q-factor that is caused by the reduction of the output resistance of a transistor during the triode region operating.

As a result, it is possible to prevent the transistor, which is oscillating, from operating in the triode region, suppress the deterioration of the Q-factor, and make the amplitude of the gate terminal be equal with that of the LC cross coupled oscillator that does not have a tail current source. With this above-described result, the oscillator according to the first embodiment can have a preferable phase noise characteristic.

It is further possible to make the amplitude of the oscillating voltage of both gate terminals of the differential amplifier be equal to that of the LC cross coupled oscillator that does not have the tail current source while suppressing the deterioration of the Q-factor and increase the SNR of the drain current. In addition, since there are no tail current source and the top current source that serve as the noise source, the noise factor Fv in Equation 1 by the above mentioned Leeson can be reduced.

Hereafter, it will be described in detail. In the LC cross coupled oscillator, a signal current with respect to the gate voltage $V_{GS}$ and a root-mean-square current $I_{noise}$ of the channel thermal noise of the transistor will be represented by the following Equations 4 and 5.

$$I_{signal} = K_0 \frac{W}{L}(V_{gs} - V_{th})^2 \tag{4}$$

$$\overline{I_{noise}} = 2\sqrt{kT\gamma g_m} \tag{5}$$

Here, $K_0$, W, L, K, T, and $g_m$ indicate a transconductance parameter, a total gate width, a gate length, the Boltzmann's constant, the absolute temperature, and a transconductance, respectively. Further, γ is a coefficient of the channel thermal noise and becomes about ⅔ in the long-channel device. The transconductance $g_m$ is represented by the following Equation 6.

$$g_m = 2K_0 \frac{W}{L}(V_{gs} - V_{th}) \tag{6}$$

Here, if Equation 6 is substituted for Equation 5, $I_{noise}$ is represented by following Equation 7.

$$\overline{I_{noise}} = 2\sqrt{2kT\gamma K_0 \frac{W}{L}(V_{gs} - V_{th})} \tag{7}$$

If the ratio of Equation 4 and Equation 7 is taken to derive the signal-to-noise ratio (SNR), the following Equation 8 will be obtained.

$$SNR = \frac{I_{signal}}{I_{noise}} = \frac{1}{2}\sqrt{\frac{K_0}{2KT\gamma} \cdot \frac{W}{L}} \cdot (V_{gs} - V_{th})^{\frac{3}{2}} \tag{8}$$

According to Equation 8, the SNR of the MOS transistor is improved to have a three-halves power of $V_{GS}$.

Figure 3:
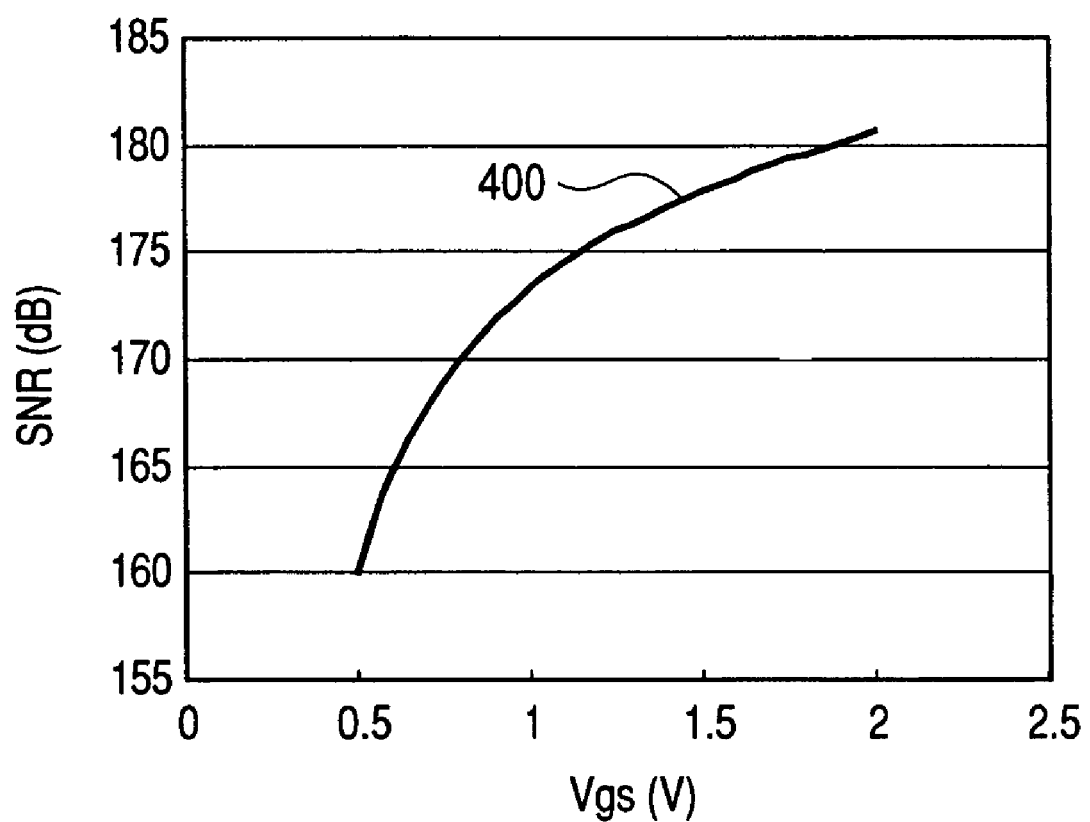
FIG. 3 is a diagram showing an SNR of an output current with respect to a gate-source voltage of a transistor of the oscillator according to the first embodiment of the invention.

The characteristic 400 of FIG. 3 shows the simulation result that takes the SNR with respect to a gate voltage of the MOS transistor at a predetermined element value. It is further confirmed that the SNR is improved according to the increase in the gate voltage, from the simulation result of the characteristic 400.

Therefore, according to the first embodiment, it is possible to simultaneously satisfy the increase in the oscillation amplitude, the removal of the tail current source that serves as the noise source, and reduction of the distortion of the oscillation waveform without deteriorating the Q-factor of the resonator, thereby achieving an oscillator that has a low phase noise characteristic.

The resonator 3 that is used for the oscillator according to the first embodiment includes a plurality of capacitors (C) and a plurality of inductors (L), respectively. However, each of capacitors and inductors may be configured by an open stub and a short stub that are installed for the impedance matching of transmission lines such as a microstrip line or a coplanar waveguide. Moreover, at least a part of the above-mentioned capacitor and the inductor may be configured by using a parasitic element that is obtained by circuit wiring lines of an element or between elements such as transistors.

The output of the oscillator according to the first embodiment may be any one of the drain terminal and the gate terminal of the differential amplifier that composes the oscillator, or both of them.

Even though the oscillator according to the first embodiment includes an MOS transistor, it may include a bipolar transistor.

The example of the oscillator according to the first embodiment will be described in more detail using the drawings as follows.

Second Embodiment

Figure 4:
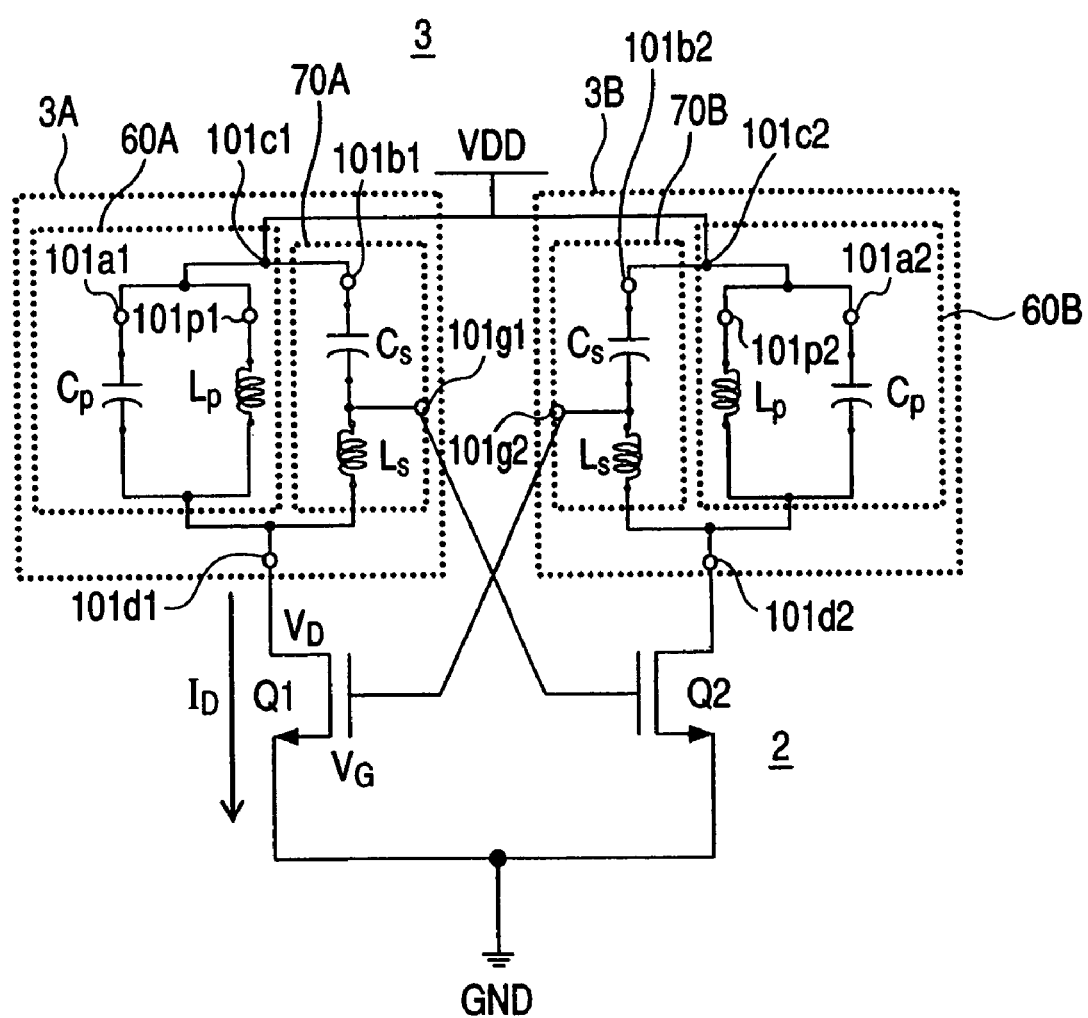
FIG. 4 is a circuit diagram showing a circuit configuration of an oscillator according to a second embodiment of the invention.

FIG. 4 is a circuit diagram showing an oscillator according to a second embodiment of the invention. The oscillator according to the second embodiment includes a differential amplifier 2, and a pair of resonators 3A, 3B that have inductors L (Ls, Lp), and capacitors C (Cs, Cp). Each resonator 3A and 3B includes parallel resonator units 60A and 60B that includes an inductor Lp and a capacitor Cp installed between terminals 101d1 and 101d2 and terminals 101c1 and 101c2, and series resonator units 70A and 70B that include the inductor Ls and the capacitor Cs arranged in this order as seen from the terminals 101d (101d1, 101d2). The central points of the inductor Ls and the capacitor Cs of the series resonator unit become terminals 101g1 and 101g2. The terminals 101c1 and 101c2 are one of the third terminals in FIG. 1, and are connected with a power supply VDD or an AC ground of the oscillator. The output terminal of the transistor Q1 that composes the differential amplifier 2 is connected with an input terminal 101d1 of the resonator 3A. An output of the resonator 3A is output from the terminal 101g1 and input to the input terminal of the other transistor Q2. An output of the transistor Q2 is connected with the input terminal 101d2 of the resonator 3B, similar to the transistor Q1 and the output of the resonator 3B is output from the terminal 101g2 to be input to the input terminal of transistor Q1. The parallel resonator units 60A and 60B are provided with power supply direct connection terminals 101p1 and 101p2 and second power supply connection terminals 101a1 and 101a2 as connection terminals to the power supply VDD. The series resonator units 70A and 70B are provided with connection terminals 101b1 and 101b2 that are one of the third terminals, as connection terminals to the power supply VDD. The power supply direct connection terminals 101p1 and 101p2 directly connect at least the inductor Lp of the parallel resonator unit 60 to the power supply VDD without interposing a tail current source therebetween. Therefore, the current that is supplied to the inductor Lp is not limited, which avoids limiting the output of the resonator by the tail current source. Meanwhile, a voltage that is different from the power supply voltage, for instance, a bias voltage may be applied to the second power supply connection terminals 101a1 and 101a2 or other connection terminals 101b1 and 101b2.

Figure 5A:
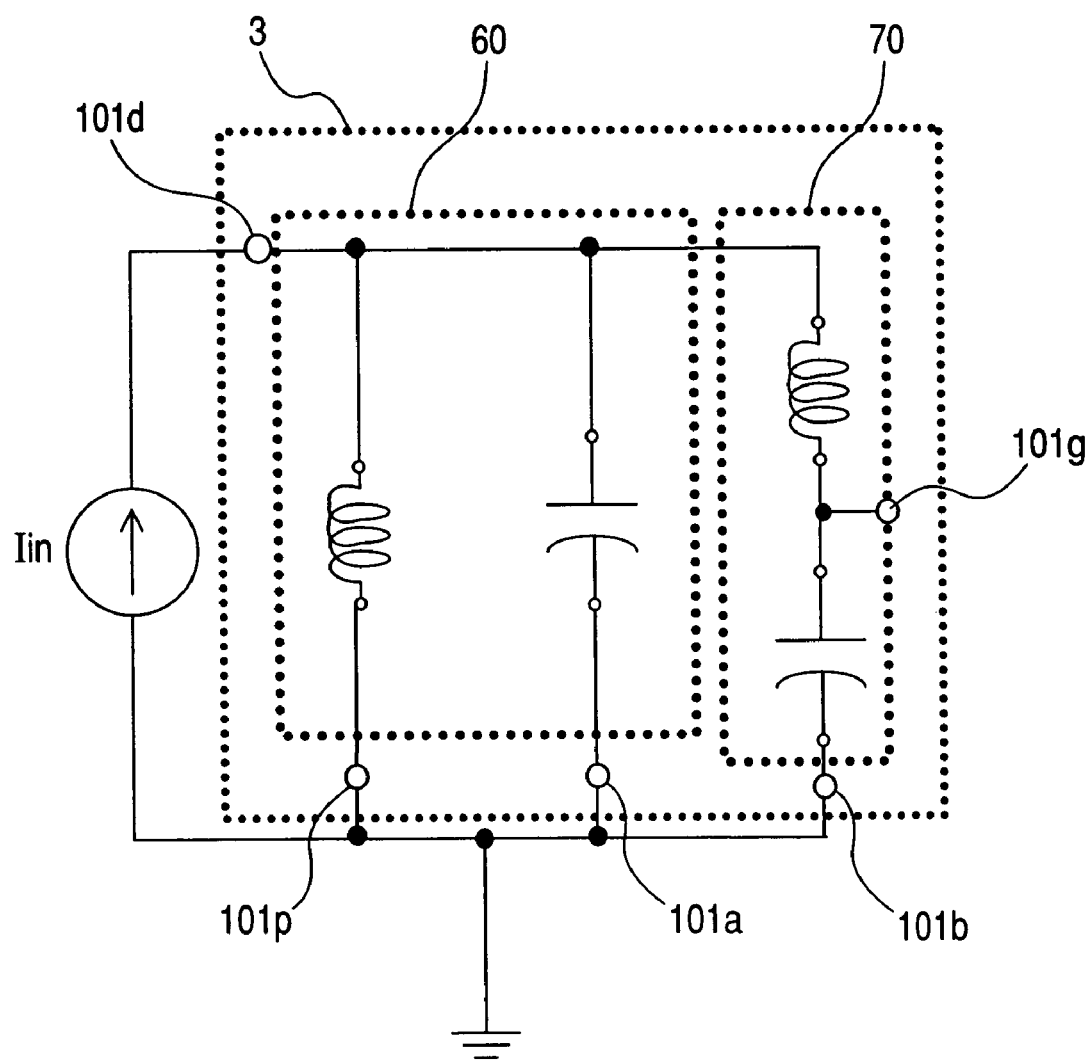
FIG. 5A is a verification circuit diagram for a resonator of the second embodiment of the invention.

The frequency characteristic of the resonator 3 will be described with reference to FIGS. 5A, 5B, and 5C. FIG. 5A is a verification circuit diagram showing the AC characteristic of the resonator 3 according to the second embodiment. The following Equation represents the AC voltage amplitudes Vd and Vg of the terminals 101d and 101g when the alternating current $I_{in}$ is input from the terminals 101d shown in FIG. 5A.

That is, the following Equation 9 represents the driving-point impedance of the terminal 101d when the AC source is connected between the terminals 101d and 101c of the resonator 3, Equation 10 represents a transfer impedance from the terminal 101d to terminal 101g.

$$V_d = \frac{\left|\left(\frac{1}{\omega C_s} - \omega L_s\right)\right| \cdot \frac{L_p}{C_p}}{j\left(\frac{L_p}{C_p} + \frac{L_p}{C_s} + \frac{L_s}{C_p}\right) - j\left(\omega^2 L_p L_s + \frac{1}{\omega^2 C_p C_s}\right)} \cdot I_{in} \quad (9)$$

$$V_g = \frac{\left|\frac{1}{\omega C_s}\right| \cdot \frac{L_p}{C_p}}{j\left(\frac{L_p}{C_p} + \frac{L_p}{C_s} + \frac{L_s}{C_p}\right) - j\left(\omega^2 L_p L_s + \frac{1}{\omega^2 C_p C_s}\right)} \cdot I_{in} \quad (10)$$

Even though the resistive component of the inductor and capacitor is omitted in Equations 9 and 10 for the sake of simplicity, it is not departed from the spirit of the present invention.

The resonant frequency of the above-mentioned each resonator 3 has two parallel resonance frequencies and one series resonance frequency. The parallel resonance frequencies are given as frequencies when the imaginary components of the denominators of Equations 9 and 10 become 0, and are represented by the following Equation 11.

$$f_{reson\ldots parallel} = \frac{1}{2\pi}\sqrt{\frac{1}{2L_p L_s}\left(\left(\frac{L_p}{C_p} + \frac{L_s}{C_s} + \frac{L_p}{C_s}\right) - \left(\left[\frac{L_p}{C_p} + \frac{L_s}{C_s} + \frac{L_p}{C_s}\right]^2 \pm \frac{4L_p L_s}{C_p C_s}\right)^{\frac{1}{2}}\right)} \quad (11)$$

On the other hand, the series resonance frequency is given as a frequency when the numerator of Equations 9 and 10 becomes 0, and represented by the following Equation 12.

$$f_{reson\ldots series} = \frac{1}{2\pi\sqrt{L_s C_s}} \quad (12)$$

Here, it is noted that while the alternating voltage of the terminal 101d in Equation 9 has a series resonance point determined by Ls and Cs, the terminal 101g does not have the series resonance point. Therefore, the reactance component of the terminal 101d is subject to the attenuation operation by a reactance element with the reverse polarity. As a result, it is understood that the voltage amplitude of the terminal 101g becomes larger than the voltage amplitude of the terminal 101d at the entire frequency region before the serial resonance frequency.

Figure 5B:
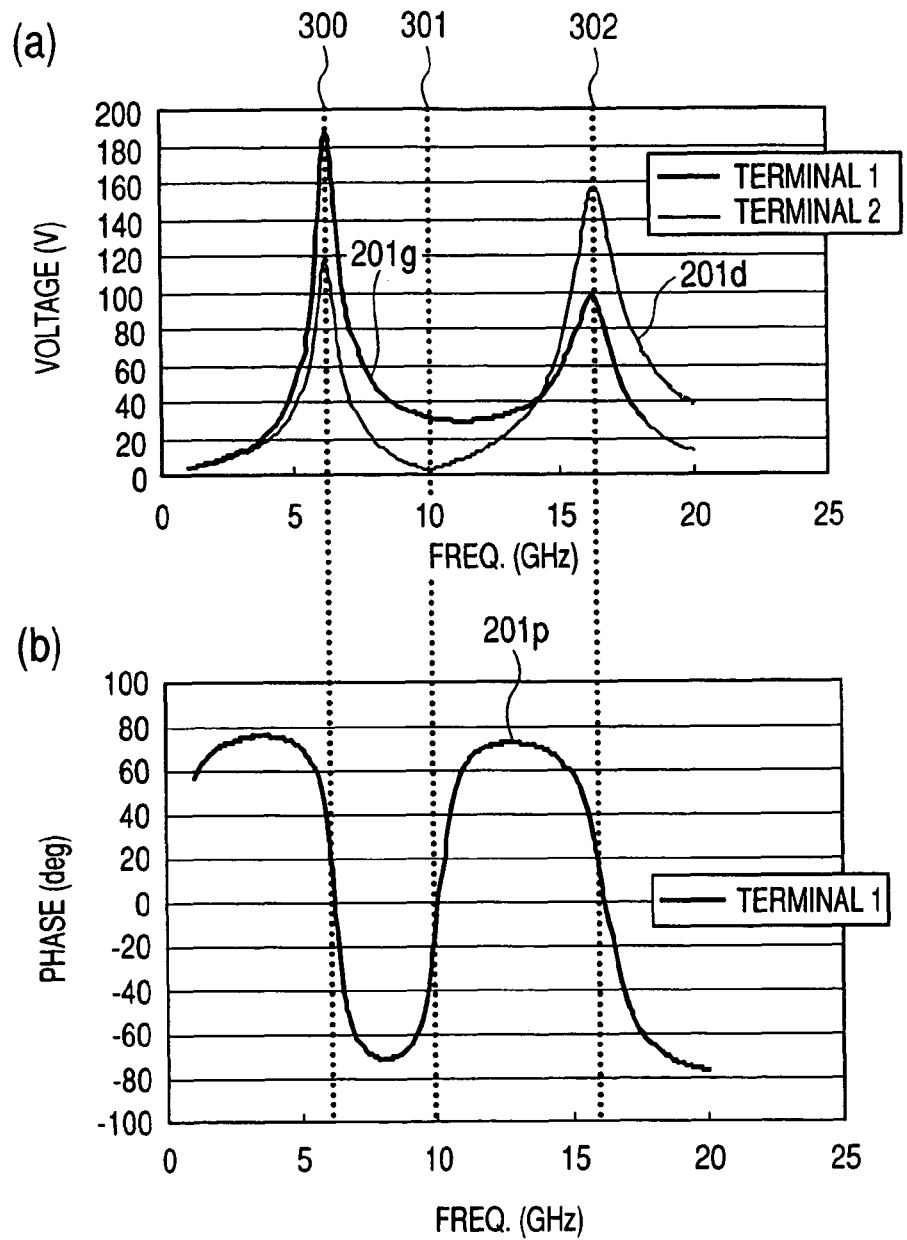
FIG. 5B is a diagram showing a frequency characteristic of the resonator shown in FIG. 5A.

FIGS. 5B and 5C show the transition of the alternating voltage characteristic and the phase characteristic with respect to the frequency of the resonator according to the second embodiment when the verification circuit of FIG. 5A is used. In FIG. 5B, reference numeral 201g denotes the amplitude characteristic of an alternating voltage of the terminal 1 (101g) shown in FIG. 5A, and reference numeral 201d denotes the amplitude characteristic of an alternating voltage of the terminal 2 (101d) shown in FIG. 5A. Further, in FIG. 5B, reference numeral 201p denotes the phase characteristic of the terminal 1 (101g) shown in FIG. 5A.

Since the capacitors Cp and Cs have high impedances in a low frequency region in FIG. 5B, only the reactance of inductor Lp is seen. Therefore, the polarity of the resonator 3 becomes inductive. Even though the polarity of the series resonator unit 70 including of the capacitor Cs and the inductor Ls is changed from the capacitive to inductive around the serial resonance point, the polarity of the serial resonator unit becomes capacitive at the serial resonance point.

As the frequency becomes higher, the inductive impedance of the inductor Lp becomes equal to the impedance due to a composite capacitor composed of a serial resonator and the capacitor Cp. Therefore, the resonator causes the first parallel resonance. The parallel resonance frequency is denoted by the broken-line 300 shown in (a) and (b) of FIG. 5B (first resonance point 300).

The series resonance is caused at a frequency that is equal to the reactance of the series resonator unit including the capacitor Cs and the inductor Ls when the frequency increases from the parallel resonance. After the serial resonance frequency, the series resonator unit 70 and the resonator 3 become inductive. The series resonance frequency is denoted by the broken line 301 shown in (a) and (b) of FIG. 5B (series resonance point 301).

Finally, at a frequency when a capacitive impedance of the capacitor Cp is equal to a composite inductive impedance of the series resonator unit 70 that becomes inductive and the inductor Lp, the second parallel resonance is caused. The parallel resonance frequency is denoted by the broken line 302 shown in (a) and (b) of FIG. 5B (second parallel resonance point 302). At a frequency after the second parallel resonance frequency, the resonator 3 is maintained to be capacitive.

The order when the polarity of the resonator is changed into inductive or capacitive is fixed even if elements that compose the resonator 3 have any value. That is, it is understood that the first parallel resonance frequency shown by the first parallel resonance point 300 is always lower than the series resonance frequency shown by the series resonance point 301. Therefore, the oscillator that includes the resonator 3 according to the second embodiment can make the oscillation voltage amplitude 201g of the gate terminal larger than the oscillation voltage amplitude 201d of the drain terminal when oscillating at the first parallel resonance frequency.

By the above-described operation, it is possible to reduce the operating time of the transistor in the triode region without adjusting the DC voltage level of the gate terminal, like the oscillator according to the related art. Therefore, it is further possible to suppress the deterioration of the Q-factor that is caused by the decrease of the output resistance of the transistor in the triode region.

It is possible to simultaneously satisfy the increase in the oscillation amplitude, the removal of the tail current source (or top current source) that serves as the noise source, and reduction of the distortion of the oscillation waveform without deteriorating the Q-factor of the resonator (those are the trade-off in the related art), and thus achieve an oscillator that has a low phase noise characteristic.

Moreover, if the following method is adopted, the effect of the second embodiment can be further improved. The element values of the inductors Ls and Lp, and the capacitors Cs and Cp are adjusted by using the characteristic when the resonance points of the above-mentioned resonator 3 are fixed in the order of the parallel resonance point, the series resonance point, and the parallel resonance point, and the series resonance point 301 is arranged close to the first parallel resonance point 300. As a result, it is further possible to increase the amplitude ratio of the oscillation voltage amplitude 201g of the gate terminal and the oscillation voltage amplitude 201d of the drain terminal.

Moreover, the first parallel resonance (frequency) point 300 may be separated from the second resonance (frequency) point 302 by adjusting the above-mentioned element values. The loop gain of the oscillator at the second parallel resonance frequency can become sufficiently smaller than 1 by setting the second resonance frequency 302 to be larger than the cutoff frequency of the transistor that composes the differential amplifier, and the oscillator can be stably oscillated at the first resonant frequency 300.

FIG. 5C shows a transfer impedance from the terminal 201d of the resonator to the terminal 201g and the driving-point impedance of the terminal 201d when a resonator has the following element values in the oscillator according to the second embodiment: Cs=70 fF, Cp=70 fF, Ls=125 pH, and Lp=75 pH. Further, in FIG. 5C, reference numeral 211g denotes the amplitude characteristic of an alternating voltage of the terminal 1 (101g) shown in FIG. 5A, and reference numeral 211d denotes the amplitude characteristic of an alternating voltage of the terminal 2 (101d) shown in FIG. 5A. In this embodiment, the oscillation voltage amplitude 211g of the gate terminal can be larger than the oscillation voltage amplitude 211d of the drain terminal when oscillating at the first parallel resonance frequency.

Figure 6:
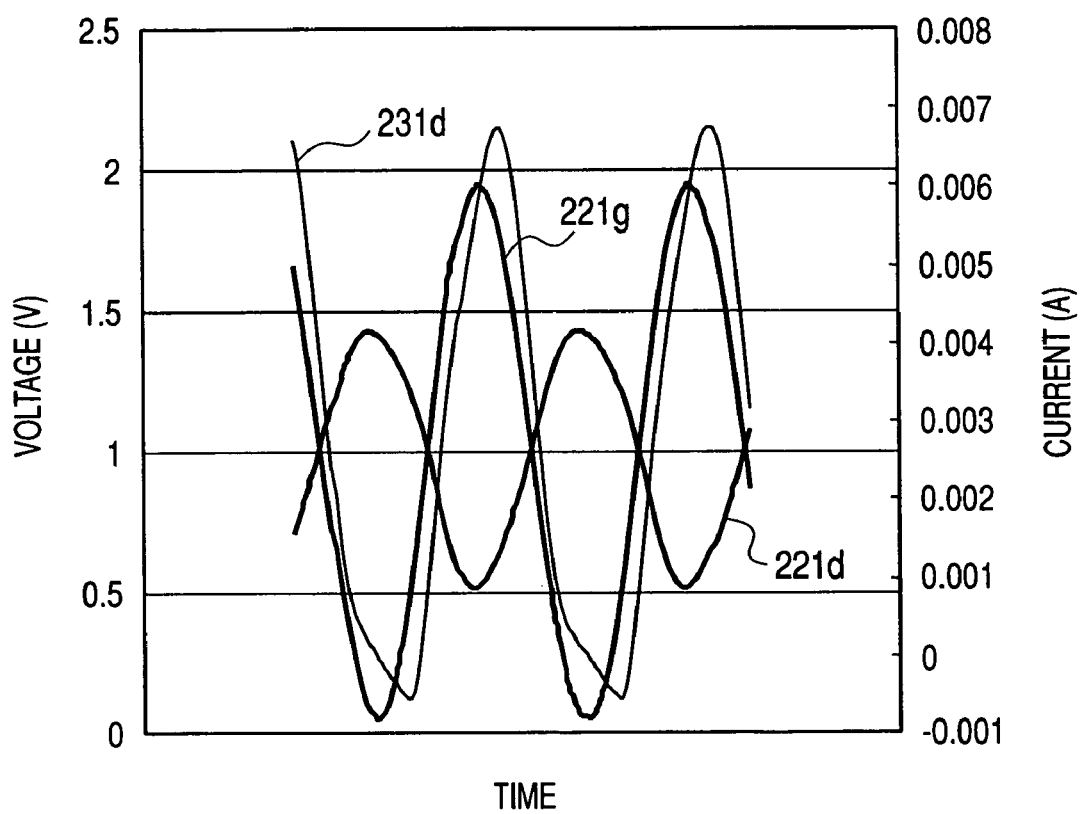
FIG. 6 is a diagram showing a transient waveform of the second embodiment of the invention.

Moreover, FIG. 6 shows a simulation result of the oscillation voltage waveform 221d of the drain terminal, the oscillation voltage waveform 221g of the gate terminal, and the current waveform 231d of the drain terminal when the resonator 3 having the above-described element values is used in the oscillator according to the second embodiment. The oscillator according to the second embodiment can reduce the operating time of the transistor in the triode region by making the voltage amplitude of the drain terminal smaller, without adjusting the DC voltage level of the gate terminal. Therefore, the Q-factor of the resonator may not be deteriorated.

Therefore, according to the second embodiment, it is possible to simultaneously satisfy the increase in the oscillation amplitude, the removal of the noise source, and the reduction of the distortion of the oscillation waveform without deteriorating the Q-factor of the resonator, thereby achieving an oscillator that has a low phase noise characteristic.

Third Embodiment

Figure 7:
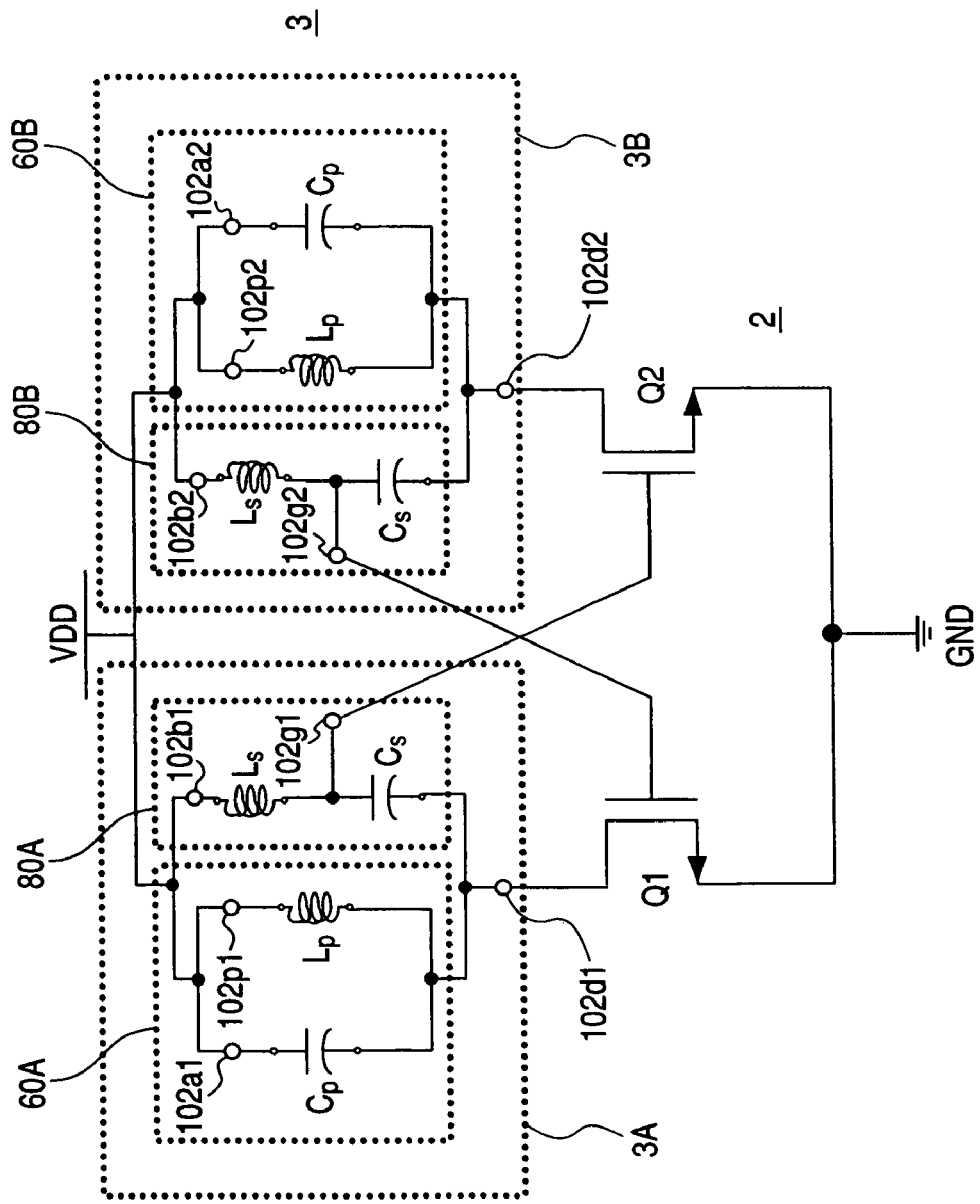
FIG. 7 is a circuit diagram showing a circuit configuration of an oscillator according to a third embodiment of the invention.

FIG. 7 is a circuit diagram that shows an oscillator according to a third embodiment of the invention. The oscillator according to the third embodiment includes a differential amplifier 2, and resonators 3A, 3B each having inductors Lp and Ls, and capacitors Cp and Cs. The resonators 3A, 3B include parallel resonator units 60A and 60B that include the inductor Lp and the capacitor Cp installed between terminals 102d1 and 102d2 and terminals 102g1 and 102g2, and series resonator units 80A and 80B that include the capacitor Cs and the inductor Ls in this order as seen from each of the terminals 102d1 and 102d2. The central points of the capacitor Cs and the inductor Ls 2 of the series resonator units 80 (80A, 80B) become terminals 102g. The output terminal of the transistor Q1 that composes the differential amplifier is connected with an input terminal 102d1 of the resonator 3A, is output from the terminal 102g1 of the series resonator unit 80A of the resonator 3A and connected to the input terminal of the other transistor Q2. An output of the transistor Q2 is connected with the resonator 3B, similar to the transistor Q1 and the output of the resonator 3B is output from the terminal 102g2 of the series resonator unit 80B to be connected to the input terminal of transistor Q1. The parallel resonator units 60A and 60B are provided with power supply direct connection terminals 102p1 and 102p2 and second power supply connection terminals 102a1 and 102a2 as connection terminals to the power supply VDD. The series resonator units 80A and 80B are provided with connection terminals 102b1 and 102b2 as connection terminals to the power supply VDD.

The same verification as that in FIG. 5 of the second embodiment is performed in order to show the transfer characteristic of the resonator 3 that composes the oscillator according to the third embodiment. Equations 13 and 14 represent alternating voltage amplitudes of the terminal 102d and the terminal 102g when the alternating current $I_{in}$ is input from the resonator terminal 102d of third embodiment.

$$V_d = \frac{\left|\left(\frac{1}{\omega C_s} - \omega L_s\right)\right| \cdot \frac{L_p}{C_p}}{j\left(\frac{L_p}{C_p} + \frac{L_p}{C_s} + \frac{L_s}{C_p}\right) - j\left(\omega^2 L_p L_s + \frac{1}{\omega^2 C_p C_s}\right)} \cdot I_{in} \tag{13}$$

$$V_g = \frac{|\omega L_s| \cdot \frac{L_p}{C_p}}{j\left(\frac{L_p}{C_p} + \frac{L_p}{C_s} + \frac{L_s}{C_p}\right) - j\left(\omega^2 L_p L_s + \frac{1}{\omega^2 C_p C_s}\right)} \cdot I_{in} \tag{14}$$

According to Equation 13, the terminal 102d of the resonator has the same equation as Equation 9, and the denominator is the same as the resonator 3 of the second embodiment. Therefore, the resonator has two parallel resonance points and one series resonance point and the order of the capacitive and the inductivity of the frequency and impedance appear is the same as the resonator 3 of the second embodiment.

From Equations 13 and 14, after the series resonance frequency, the voltage amplitude of the terminal 102g is always larger than the voltage amplitude of the terminal 102d. That is, the oscillator according to the third embodiment that has the above-mentioned resonator 3 can make the oscillation voltage amplitude of the gate terminal larger than the oscillation voltage amplitude of the drain terminal when oscillating at the second parallel resonance point. Therefore, with this circuit configuration according to the third embodiment, the phase noise can be reduced.

Similar to the second embodiment, the element values of the inductors Ls and Lp, and the capacitors Cs and Cp, which compose the resonator 3, are adjusted by using the characteristic that the resonance points of the above-mentioned resonator 3 are fixed in the order of the parallel resonance point, the series resonance point, and the parallel resonance point, and the series resonance point 301 of FIG. 5B is arranged close to the second parallel resonance point 302. As a result, it is further possible to increase the amplitude ratio of the oscillation voltage amplitude of the gate terminal and the oscillation voltage amplitude of the drain terminal.

Moreover, the first parallel resonance point 300 may be separated from the second resonance point 302 by adjusting the above-mentioned element values. The alternating voltage values of the terminal 102g of the resonator 3 are in proportion to the value of Ls and have the small value in the low frequency region. The higher the frequency is, the larger the alternating voltage values are. Therefore, the first parallel resonance frequency 300 and Ls of the resonator 3 are set such that the loop gain of the oscillator at the first parallel resonance frequency 300 is sufficiently smaller than 1, and thus the oscillator can be stably oscillated at the second resonance frequency 302.

Figure 8:
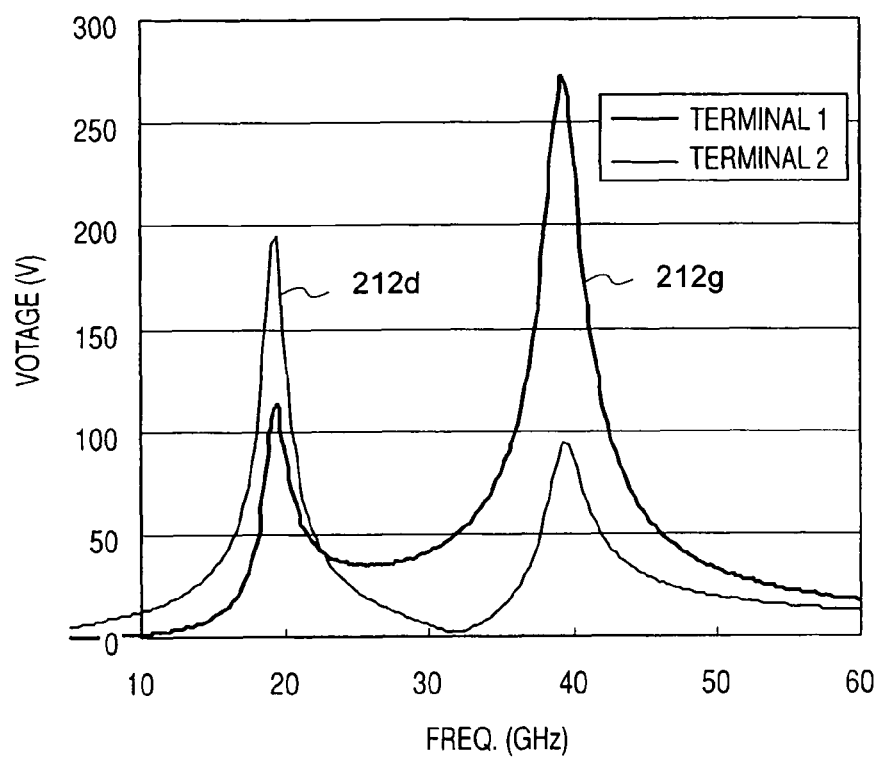
FIG. 8 is a diagram showing a frequency characteristic of a resonator of the third embodiment of the invention.

FIG. 8 shows a simulation result of frequency characteristic of the alternating voltage amplitude 212d of the drain terminal 102d (terminal 1) and the alternating voltage amplitude 212g of the gate terminal 102g (terminal 2) when the element values of the resonator in the oscillator according to the third embodiment are adjusted as follows: Cs=100 fF, Cp=300 fF, Ls=250 pH, and Lp=150 pH. The relationship between the alternating voltage amplitude 212d and the alternating voltage amplitude 212g of the gate terminal reverses as compared with the second embodiment (FIG. 5C), and the oscillation voltage amplitude 212g of the gate terminal may be larger than the oscillation voltage amplitude 212d of the drain terminal when oscillating at the second parallel resonance frequency 302 (about 40 GHz in the example of FIG. 8).

Figure 9:
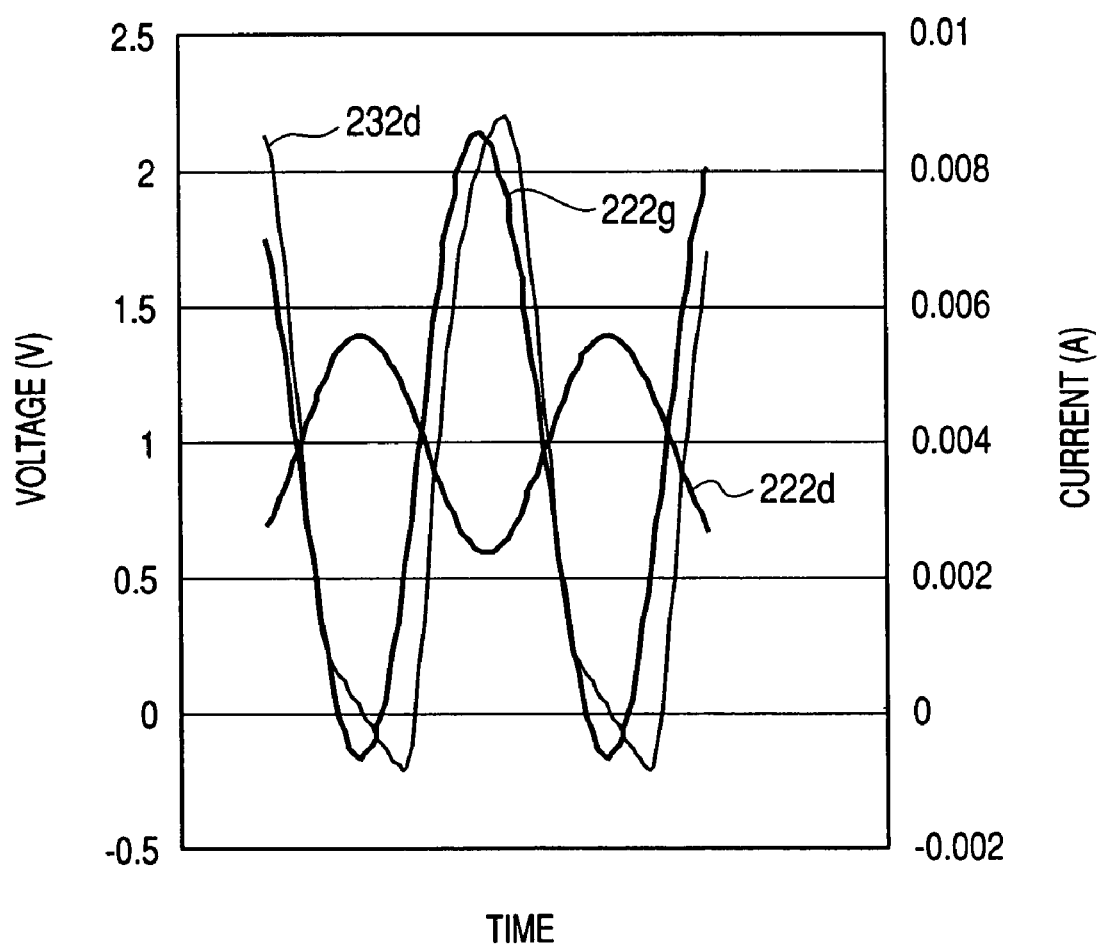
FIG. 9 is a diagram showing a transient waveform of the third embodiment of the invention.

Further, FIG. 9 is a simulation result of the oscillation voltage waveform 222d of the drain terminal, the oscillation voltage waveform 222g of the gate terminal, and the oscillation current waveform 232d of the drain terminal in the oscillator. The oscillator according to the third embodiment can reduce the operating time of the transistor in the triode region by making the voltage amplitude of the drain terminal smaller, without adjusting the DC voltage level of the gate terminal. Therefore, the Q-factor of the resonator does not become deteriorated.

According to the third embodiment, it is possible to simultaneously satisfy the increase in the oscillation amplitude, the removal of the noise source, and the reduction of the distortion of the oscillation waveform without deteriorating the Q-factor of the resonator, and thus achieve an oscillator that has a low phase noise characteristic.

First Modification

Figure 10:
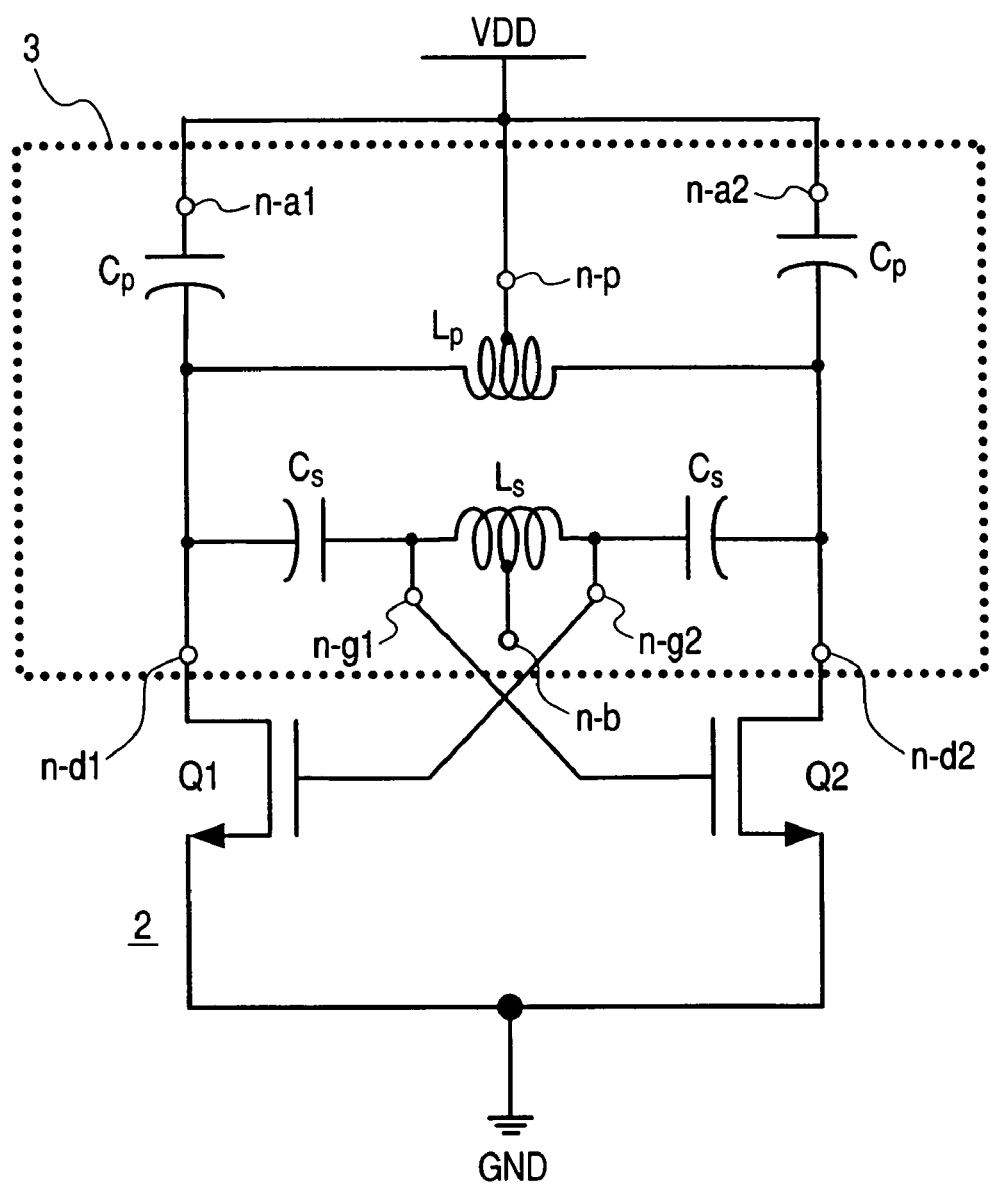
FIG. 10 is a circuit diagram showing an oscillator according to a modification of the third embodiment of the invention.

Next, FIG. 10 shows an example of an oscillator that is modified from the oscillator according to the third embodiment and includes a resonator 3 in which the inductor Lp of the parallel resonator unit and the inductor Ls of the series resonator unit are used as differential inductors. This oscillator is configured such that a gate bias voltage of the transistors Q1 and Q2 is applied from the terminal n-b connected with the central point of the inductor Ls of the series resonator unit, and the power supply voltage VDD is applied from the terminal n-p connected with the central point of the inductor Lp of the parallel resonator unit. With this configuration, it is possible to independently set the gate bias voltage from the power supply voltage VDD. As a result, it is possible to easily design the oscillation frequency of the oscillator and the consumed current.

Fourth Embodiment

Figure 11:
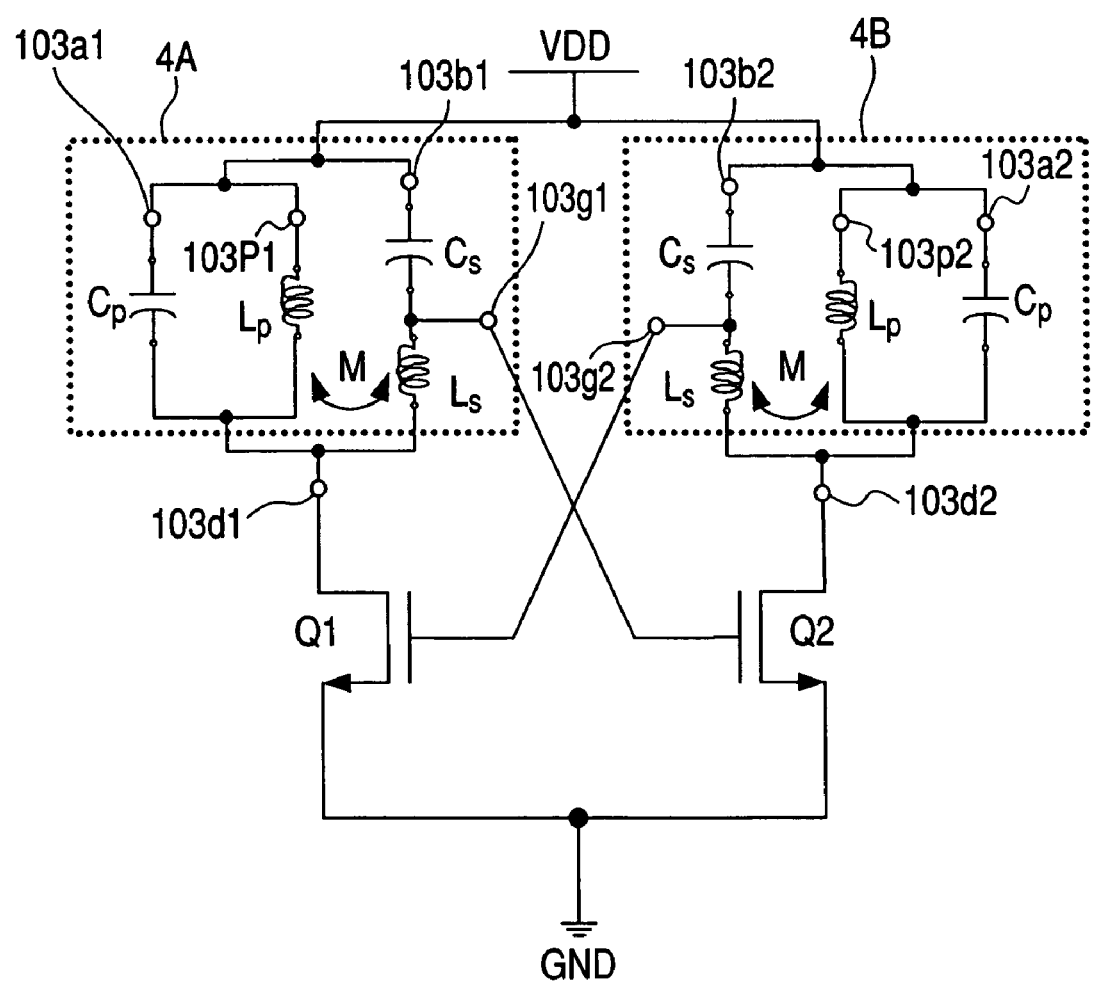
FIG. 11 is a circuit diagram showing a circuit configuration of an oscillator according to a fourth embodiment of the invention.

FIG. 11 is a circuit diagram showing an oscillator according to a fourth embodiment of the invention. The resonators 4 (4A, 4B) that composes the oscillator is mutually inductively coupled to the inductors Lp and Ls that composes the resonator 3 of the oscillator according to the second embodiment.

An output terminal of a transistor Q1 that composes a differential amplifier 2 is connected with an input terminal 103d1 of the resonator 4A, and an output of the resonator 4A is output from a terminal 103g1 and connected with an input terminal of the other transistor Q2. An output of the transistor Q2 is connected to the input terminal 103d2 of the resonator 4B, similar to the transistor Q1. An output of the resonator 4B is output from the terminal 103g2 and connected to the input terminal of the transistor Q1. The parallel resonator units A and B are provided with power supply direct connection terminals 103p1 and 103p2 and second power supply connection terminals 103a1 and 103a2 as connection terminals to the power supply VDD. The series resonator units A and B are provided with connection terminals 103b1 and 103b2 as connection terminals to the power supply VDD.

Figure 12A:
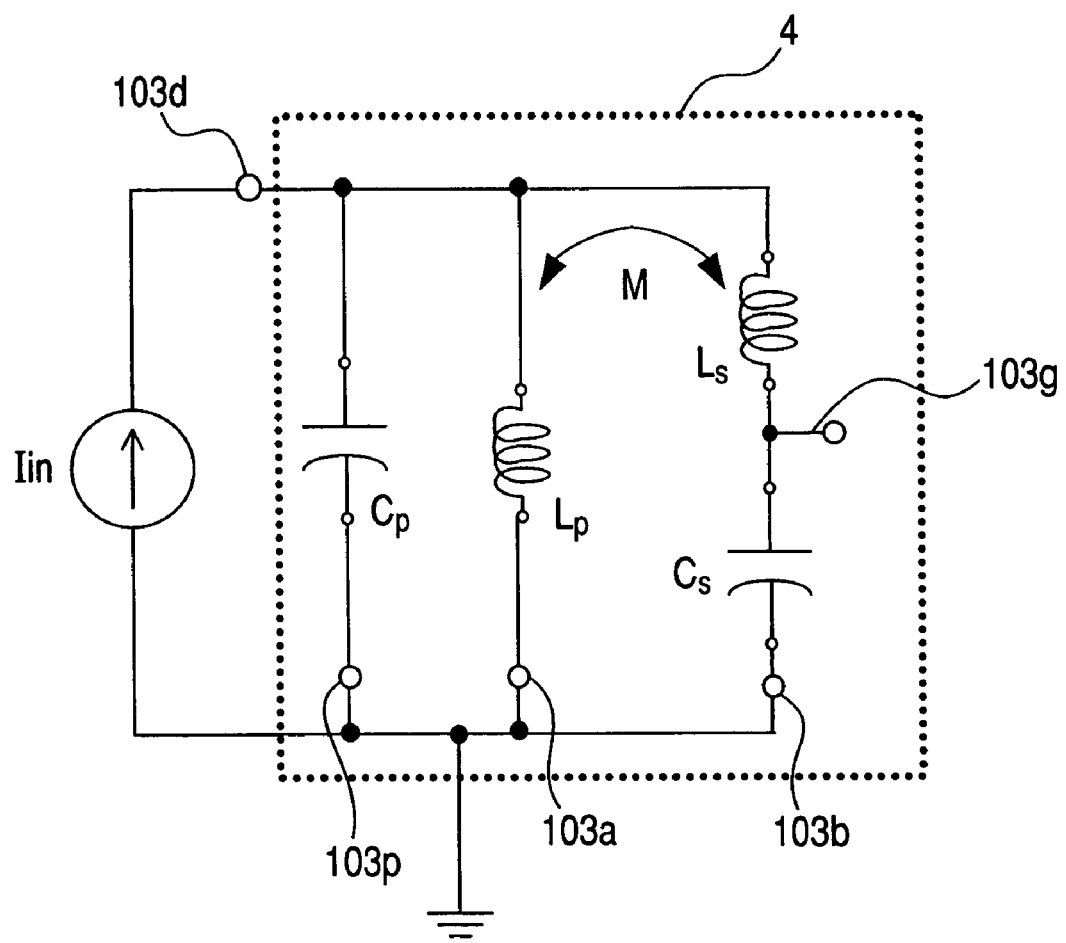
FIG. 12A is a circuit diagram for verifying a resonator that composes the fourth embodiment of the invention.

The frequency characteristic of the resonator 3 will be described with reference to FIGS. 12A, 12B, and 12C. FIG. 12A is a verification circuit diagram showing the AC characteristic of the resonator 4. Reference numeral 103g of FIG. 12B denotes an alternating voltage amplitude of the terminal 103d when the magnitude of an mutual inductance M is changed in FIG. 12A. Further, reference numeral 213g of FIG. 12C denotes the amplitude characteristic of the alternating voltage of the terminal 1 (103g) of FIG. 12A, and reference numeral 213d denotes the amplitude characteristic of the alternating voltage of the terminal 2 (103d) of FIG. 12A.

The following Equations 15 and 16 represent the alternating voltage amplitudes of the terminal 103d and the terminal 103g when the alternating current $I_{in}$ is input from the terminal 103d of FIG. 12A.

a resistor, and (4) lowering of the distortion of an oscillation waveform, which are derived from Equations 1 and 2.

Figure 12B:
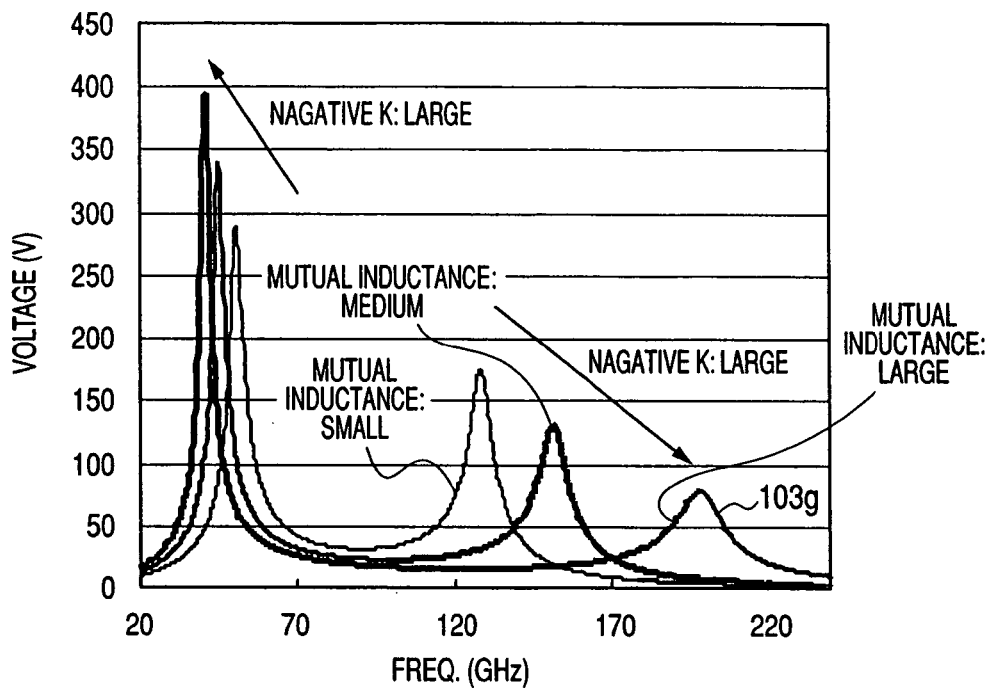
FIG. 12B is a diagram showing a frequency characteristic in the verification circuit diagram for the resonator shown in FIG. 12A.

In addition, as shown in FIG. 12B, the resonator with a negative mutual inductance has an effect that expands the frequency between the resonant frequencies of the first parallel resonance point and the second parallel resonance point compared with the resonator according to the second embodiment that has the same element values of the inductors Ls and Lp, and the capacitors Cs and Cp. With this effect, it is easy to dispose the second parallel resonance point in a higher frequency region than the cutoff frequency of the transistor, and thus the oscillator can be stably oscillated at the first parallel resonance frequency.

Moreover, the resonator according to the fourth embodiment uses the mutual inductance M by disposing the inductors Lp and Ls close to each other. Therefore, the two inductors Lp and Ls may be mounted in one inductor mounting area. As a result, it is possible to reduce an area for one inductor, and when the inductor is integrated in an IC chip, it results in low cost.

Figure 12C:
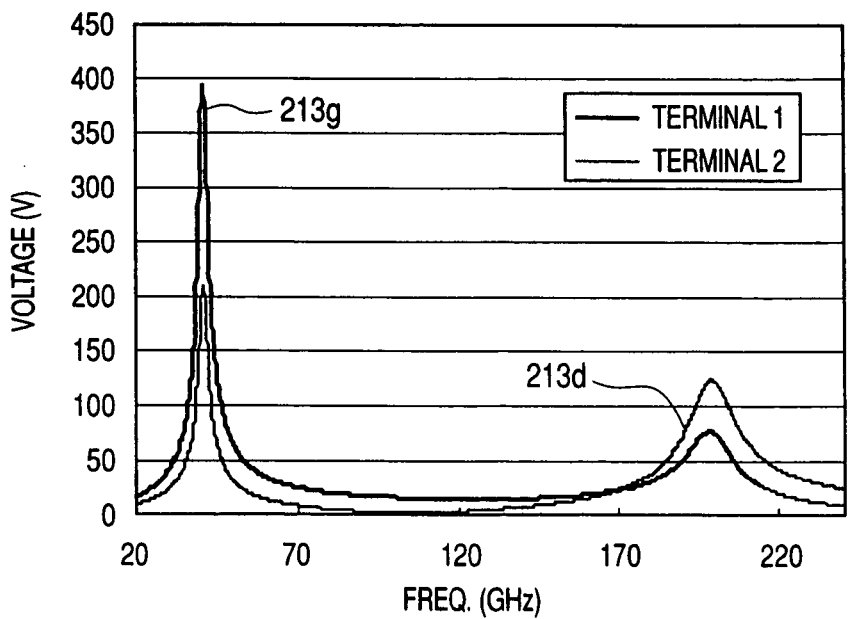
FIG. 12C is a diagram showing a frequency characteristic of the resonator shown in FIG. 12A.

FIG. 12C shows a transfer impedance from the terminal 103d of the resonator to the terminal 103g and the simulation result of the frequency characteristic of the driving-point impedance of the terminal 103d when the element values of $$V_D = \frac{\frac{L_p}{C_p}\left\{\frac{1}{j\omega C_3} + j\omega\left(L_s - \frac{M^2}{L_p}\right)\right\}}{-\omega^2(L_s L_p - M^2) + \left\{\frac{L_p}{C_s} + \frac{L_p}{C_p}\left(1 - \frac{M}{L_p}\right) + \frac{L_s - M}{C_p}\right\} - \frac{1}{\omega^2 C_s C_p}} \cdot I_{in} \quad (15)$$

$$V_G = \frac{\frac{L_p}{C_p}\left\{\frac{1}{j\omega C_s}\left(1 - \frac{M}{L_p}\right)\right\}}{-\omega^2(L_s L_p - M^2) + \left\{\frac{L_p}{C_s} + \frac{L_p}{C_p}\left(1 - \frac{M}{L_p}\right) + \frac{L_s - M}{C_p}\right\} - \frac{1}{\omega^2 C_s C_p}} \cdot I_{in} \quad (16)$$

Here, M of Equations 15 and 16 indicates the mutual inductance of Ls and Lp, and is represented by Equation 17 when using a coupling coefficient K. The coupling coefficient K represents the degree of coupling of the magnetic field of Ls and Lp, and has negative or positive polarity according to the direction where magnetic fields are coupled.

$$M = K\sqrt{L_s L_p} \text{ (but, } K \leq \pm 1\text{)} \quad (17)$$

According to Equation 17, when the mutual inductance M has a negative value, that is, the coupling coefficient is negative, if the capacitors Cp and Cs and the inductors Lp and Ls that compose the resonator 4 have the same value, the alternating voltage value of the terminal 103g of the resonator 4 is always larger than the voltage of the terminal 101g of the resonator 3 in the second embodiment. Meanwhile, the alternating voltage value of the terminal 103d is always smaller than the voltage of the terminal 101d of resonator 3 in the second embodiment regardless of the positive or the negative value of the mutual inductance M.

That is, the oscillator having the resonator 4 with the same element values as the second embodiment according to the fourth embodiment can increase the ratio of the gate voltage amplitude value and the drain terminal voltage amplitude value, which is the advantage of the invention.

The increase in the above-mentioned voltage of the terminal 103g means the increase in the Q-factor of the terminal 103g. That is, the oscillators according to the fourth embodiment satisfies the four factors: (1) increase in oscillation amplitude, (2) increase in Q of a resonator, (3) reduction of the noise factor caused by the thermal noise of a transistor and the resonator in the oscillator according to the fourth embodiment are adjusted as follows: Cs=60 fF, Cp=70 fF, Ls=60 pH, Lp=60 pH, and the coupling coefficient K is −0.6. As shown in FIG. 12C, the oscillator according to the fourth embodiment can improve the ratio of the gate voltage amplitude value and the drain terminal voltage amplitude value, which is an advantage of the invention.

Figure 13A:
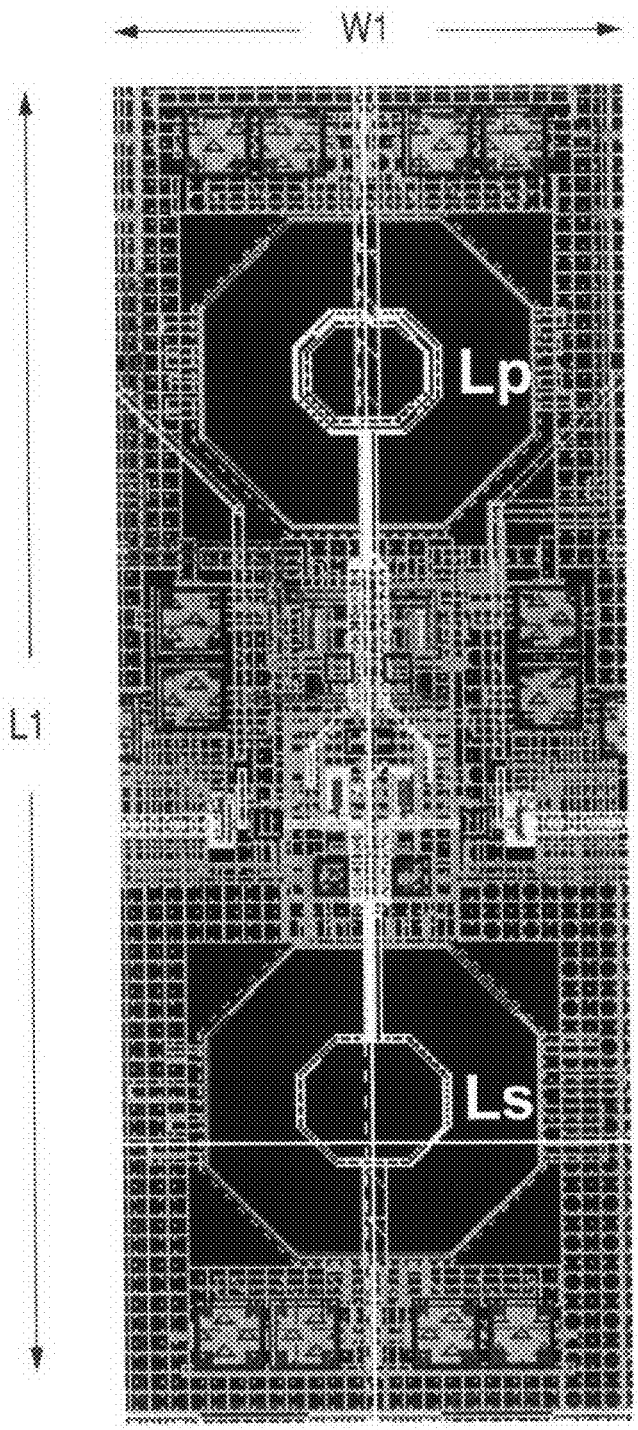
FIG. 13A is a diagram showing an example of a layout when the oscillator shown in FIG. 10 is integrated in an IC chip.

Next, with reference to FIGS. 13A and 13B, the effect that reduces the mounting area in the IC chip by disposing the inductors Lp and Ls of the pair of resonators to be closer to each other and using the mutual inductance M will be described. First, FIG. 13A shows an example of the layout when the oscillator shown in FIG. 10 is integrated in the IC chip. As shown in FIG. 13A, the inductor Lp of the resonator is disposed above the IC chip and the inductor Ls is disposed below the IC chip. The elements of the resonators or the transistors Q1 and Q2 may be arranged between the inductors Lp and Ls or at the periphery thereof. As an example, the length L1 of the IC chip is 670 μm and the width W1 is 210 μm.

Figure 13B:
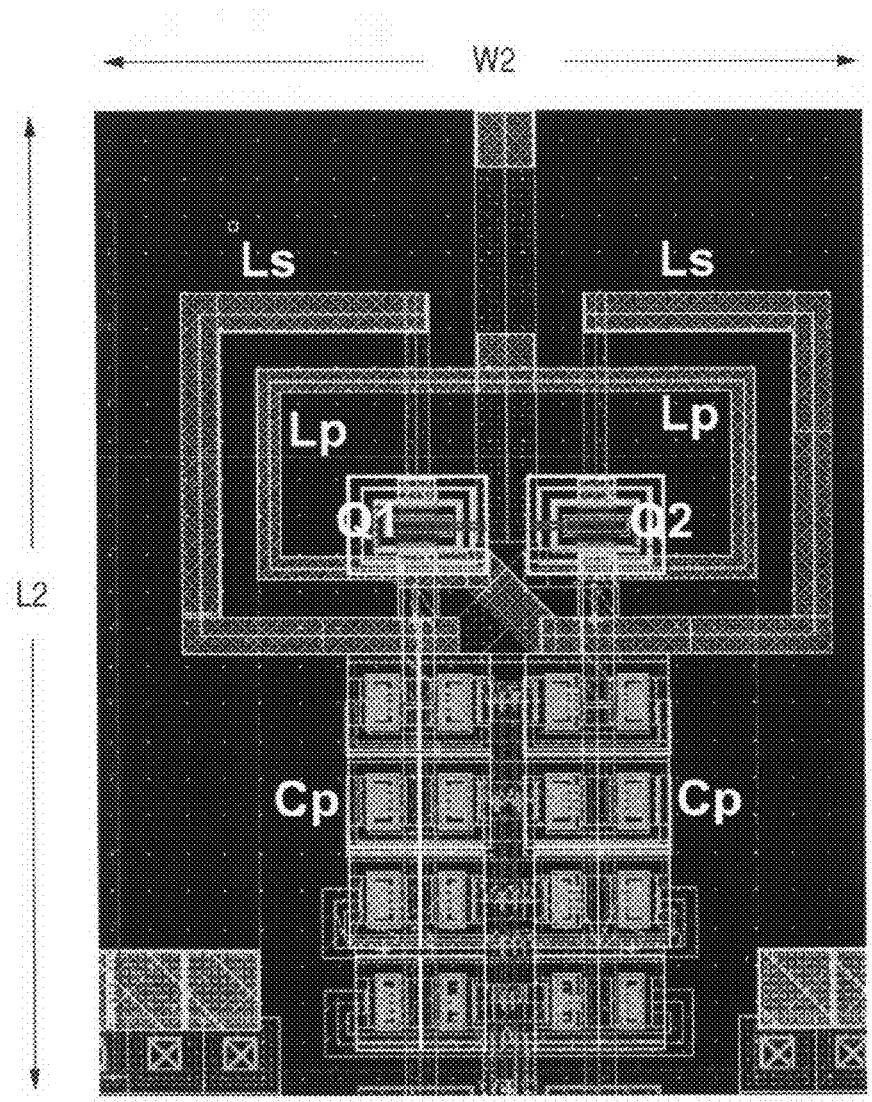
FIG. 13B is a diagram showing an example of a layout when the oscillator shown in FIG. 11 is integrated in an IC chip.

Next, FIG. 13B shows an example of the layout when the oscillator (which is functionally the same as the oscillator shown in FIG. 10) shown in FIG. 11 is integrated in the IC chip. As shown in FIG. 13B, the usage area can be reduced by disposing the inductors Lp and Ls of the pair of resonators in the same area. The capacitor Cs has been achieved by a parasitic capacitor Cgs of the transistor Q1. For example, the length L2 of the IC chip is 120 μm, and the width W2 is 105 μm. According to the layout shown in FIG. 13B that uses the mutual inductance M, the area decreases to 1/11 of the layout of FIG. 13A, that is, the area is significantly reduced in the IC chip.

Second Modification

Figure 14:
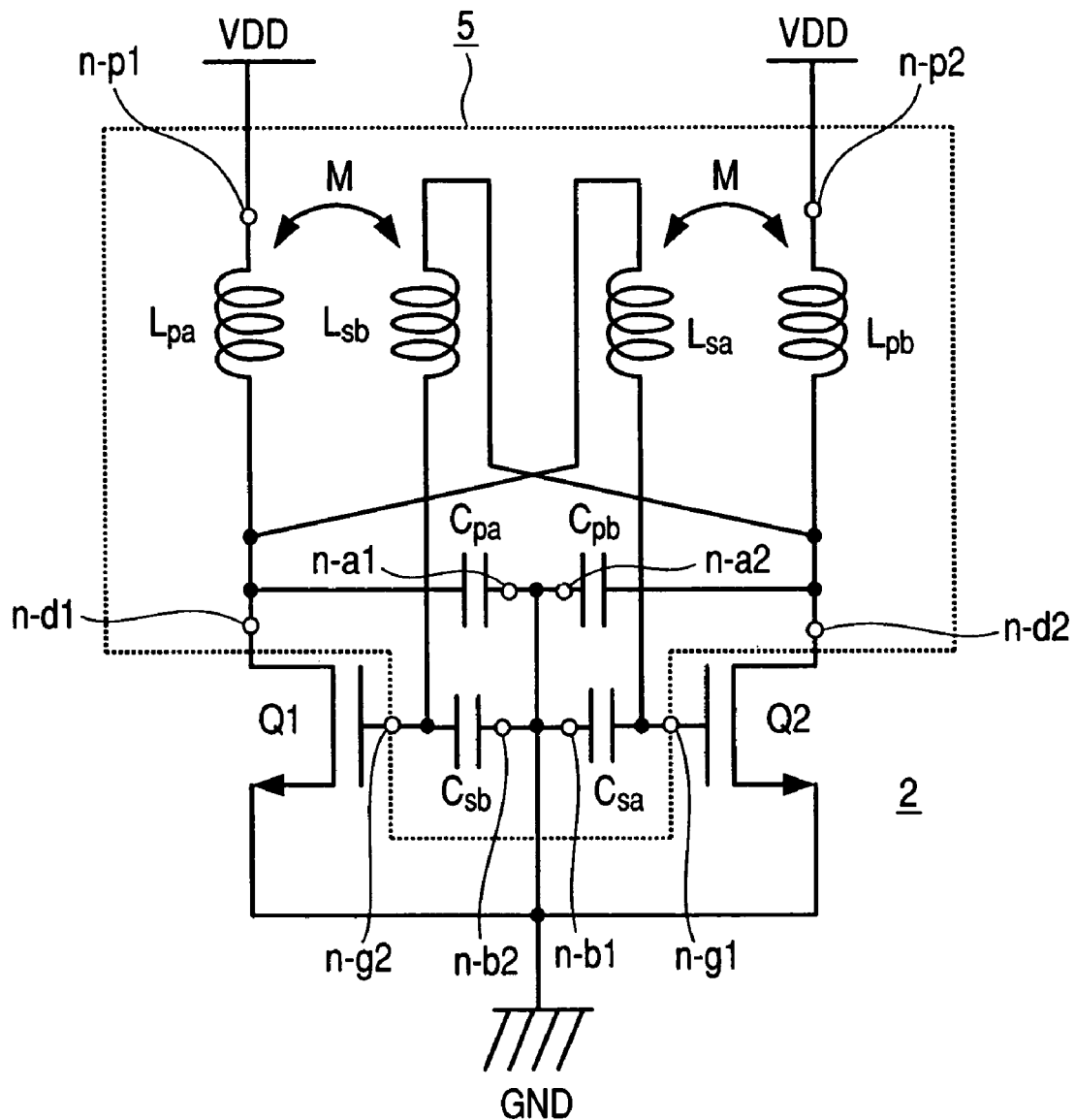
FIG. 14 is a circuit diagram showing an oscillator according to a modification of the fourth embodiment of the invention.

Next, the modification of the fourth embodiment according to the invention will be described. A resonator 5 that has a negative mutual inductance M of the inductors Lp and Ls of the pair of resonators according to the fourth embodiment connects a drain terminal having a reversed phase of the differential amplifier 2 and the inductor Lp of one of resonators, and can be easily obtained by positively magnetically coupling the inductor Lp to the inductor Ls of the other resonator, as shown in FIG. 14.

That is, if the inductors and the capacitors corresponding to the resonator 4A shown in FIG. 11 are denoted by Lsa, Lpa, Csa, and Cpa, respectively, and the inductors and the capacitors corresponding to the resonator 4B are denoted by Lsb, Lpb, Csb, and Cpb, in FIG. 14, the resonator 5 includes inductors Lpa, Lsb, Lsa, and Lpb that are sequentially arranged in the horizontal direction, capacitors Cpa and Cpb that are sequentially arranged in the horizontal direction below the inductors, and capacitors Csb and Csa that are arranged in the horizontal direction below the capacitors Cpa and Cpb. The inductors Lpa and Lsb and the inductors Lsa and Lpb are positively magnetically coupled. Further, the terminals n-p1, n-p2, n-a1, n-a2, n-d1, n-d2, n-g1, n-g2, n-b1, and n-b2 are connected with the power supply as shown in FIG. 14.

In this modification, the power supply direct connection terminals n-p1 and n-p2 are connected with the power supply VDD, and the commonly grounded terminals of the transistors Q1 and Q2 of the differential amplifier 2 are directly connected with the ground terminal. Further, the transfer impedance from the input terminals n-d1 and n-d2 of the resonator 5, to which drain terminals of the transistors Q1 and Q2 serving as outputs of the differential amplifier 2 are connected, to the output terminals n-g1 and n-g2 of the resonator 5, to which inputs of the differential amplifier 2 (gate terminals of the transistors Q1 and Q2) is connected, becomes larger than the driving-point impedance of the input terminals n-d1 and n-d2 at the oscillation frequency. Therefore, during the oscillating operation, the oscillation voltage amplitude Vg of the gate terminals of the transistors Q1 and Q2 becomes large, and the oscillation voltage amplitude Vd of the drain terminal becomes small.

Therefore, according to the second modification, it is possible to simultaneously satisfy the increase in the oscillation amplitude, the removal of the noise source, and the reduction of the distortion of the oscillation waveform without deteriorating the Q-factor of the resonator, thereby achieving an oscillator that has a low phase noise characteristic. It is further possible to significantly reduce the area in the IC chip.

Fifth Embodiment

Figure 15:
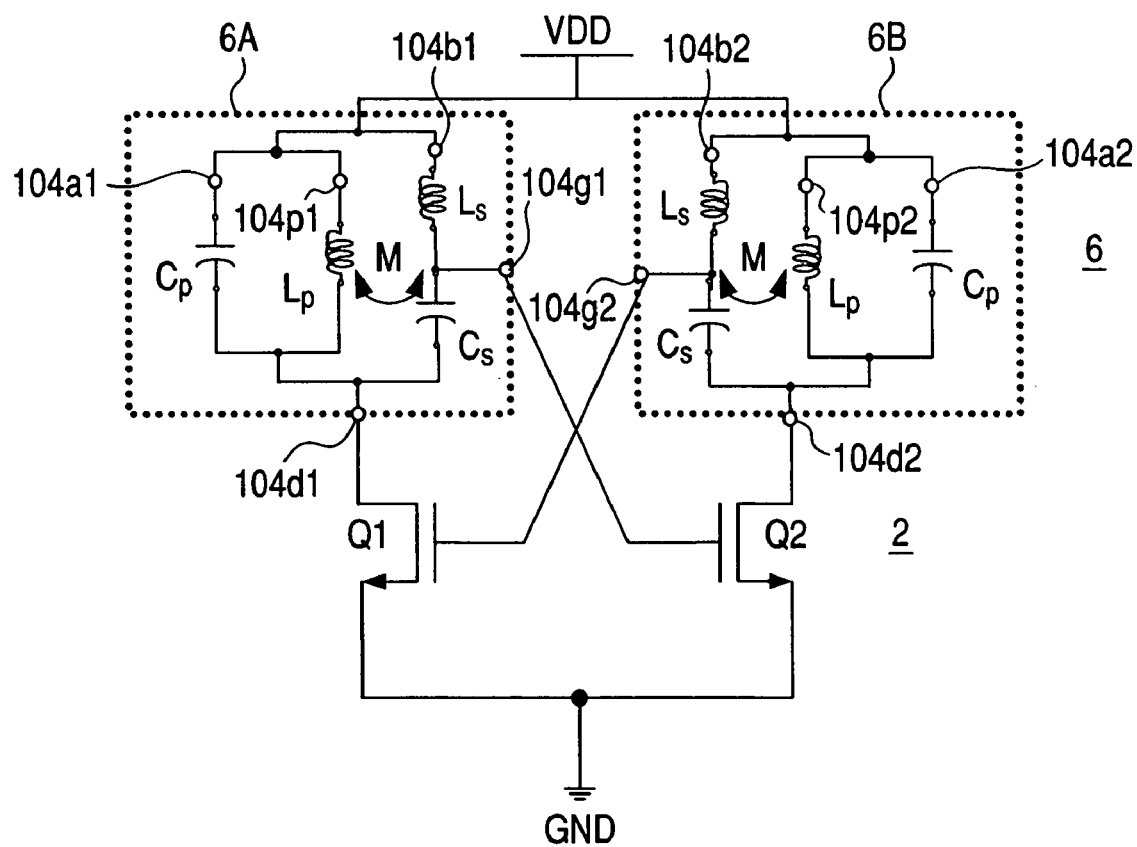
FIG. 15 is a circuit diagram showing a circuit configuration of an oscillator according to a fifth embodiment of the invention.

FIG. 15 is a circuit diagram showing an oscillator according to a fifth embodiment of the invention. Resonators 6 (6A, 6B) that compose the oscillator is configured to be mutually inductively coupled to the inductors Lp and Ls that compose the resonator 3 (3A, 3B) according to the third embodiment.

An output terminal of the transistor Q1 that composes a differential amplifier 2 is connected to an input terminal 104*d*1 of the resonator 6A, and an output of the resonator 6A is output from the terminal 104*g*1 and input to the input terminal of the other transistor Q2. An output of the transistor Q2 output is input to an input terminal 104*d*2 of the resonator 6B, similar to the transistor Q1, and an output of resonator 6B is output from a terminal 104*g*2 and input to the input terminal of the other transistor Q1. The parallel resonator units A and B are provided with power supply direct connection terminals 103*p*1 and 103*p*2 and second power supply connection terminals 103*a*1 and 103*a*2 as connection terminals to the power supply VDD. The series resonator units A and B are provided with connection terminals 103*b*1 and 103*b*2 as connection terminals to the power supply VDD.

The verification similar to that shown by FIG. 12A of the fourth embodiment is performed in order to show the transfer characteristic of the resonator 6 that composes the oscillator according to the fifth embodiment. The following Equations 18 and 19 represent alternating voltage amplitudes of the terminal 104*d* and the terminal 104*g* when the alternating current $I_{in}$ is input from the terminal 104*d* of the resonator 6 according to the fifth embodiment.

$$V_D = \frac{j\frac{L_p}{C_p}\left\{\omega\left(L_s - \frac{M^2}{L_p}\right) - \frac{1}{\omega C_s}\right\}}{-\omega(L_s L_p - M^2) + \left\{\frac{L_p}{C_s} + \frac{L_p}{C_p}\left(1 - \frac{M}{L_p}\right) + \frac{L_s - M}{C_p}\right\} - \frac{1}{\omega^2 C_s C_p}} \cdot I_{in} \quad (18)$$

$$V_G = \frac{j\frac{L_p}{C_p}\left\{\omega\left(L_s - \frac{M^2}{L_p}\right) - \frac{1}{\omega C_s} \cdot \frac{M}{L_p}\right\}}{-\omega^2(L_s L_p - M^2) + \left\{\frac{L_p}{C_s} + \frac{L_p}{C_p}\left(1 - \frac{M}{L_p}\right) + \frac{L_s - M}{C_p}\right\} - \frac{1}{\omega^2 C_s C_p}} \cdot I_{in} \quad (19)$$

Here, M refers a mutual inductance of the inductors Lp and Ls, similar to the fourth embodiment.

If the mutual inductance M is negative, the second term of the numerator in Equation 19 is changed to be positive. Therefore, the alternating voltage value of the terminal 104*g* exceeds the voltage of the terminal 104*d* in a frequency range that is higher than the series resonance frequency.

Moreover, similarly to the fourth embodiment, the resonator 6 with a negative mutual inductance has an effect that expands the frequency between the resonant frequencies of the first parallel resonance point 300 and the second parallel resonance point 302 compared with the resonator 3 according to the third embodiment that has the same element values of the inductors Ls and Lp, and the capacitors Cs and Cp. With this effect, it is easy to allow the first parallel resonance frequency 300 to have a value such that the loop gain of the oscillator is sufficiently smaller? than 1 at the first parallel resonance frequency 300, as compared with the third embodiment, and thus the oscillator can be stably oscillated at the second parallel resonance frequency 302.

In the meantime, when the mutual inductance M is positive, the series resonance point is generated in the terminal 104*g* of the resonator 6. As represented by Equation 17, since the mutual inductance M is not larger than the inductance of Lp and Ls, a ratio M/Lp of the mutual inductance M and the inductance Lp of the second term of the numerator in Equation 19 is always 1 or smaller. That is, the value of the numerator of Equation 19 becomes 0 at a lower frequency than that of the numerator of Equation 18. This means that the series resonance frequency of the terminal 104g is always lower than the series resonance frequency of the terminal 104d.

By approaching the series resonance point of the terminal 104g to the first parallel and serial resonance frequencies of the resonator 6 in the fifth embodiment, the value of the numerator of Equation 19 at the first parallel resonance point may be close to 0, and the alternating voltage of the terminal 104d can have very small value. Therefore, it is possible to make the loop gain of the oscillator significantly smaller than 1 at the first parallel resonance frequency using the element values of the resonator set as the above and the mutual inductance M, and thus the oscillator can be stably oscillated at the second resonance frequency.

Figure 16:
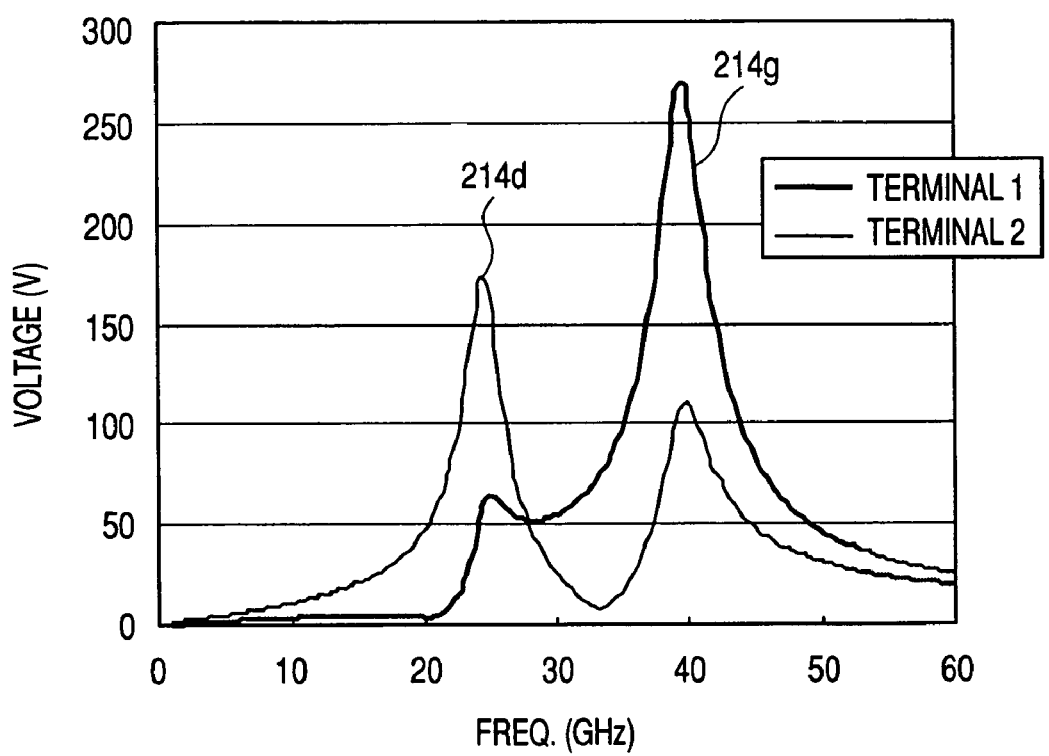
FIG. 16 is a diagram showing a frequency characteristic of a resonator of the fifth embodiment of the invention.

FIG. 16 shows the frequency characteristic 214g of the alternating voltage of the terminal 104g (terminal 1) and the frequency characteristic 214d of the alternating voltage of the terminal 104d (terminal 2) when the element values of the oscillator according to the fifth embodiment are set as follows: Cs=200 fF, Cp=100 fF, Ls=250 pH, Lp=150 pH, and the coupling coefficient K is 0.3. As shown in FIG. 16, according to the fifth embodiment, even though the difference between the first parallel resonance frequency and the second resonance frequency does not expand, the difference between the first parallel resonance frequency and the oscillation amplitude of the alternating voltage at the second resonance frequency can be enlarged when considering the frequency characteristic 214g. Therefore, the oscillator can be stably oscillated at the second resonance frequency.

Therefore, according to the fifth embodiment, it is possible to simultaneously satisfy the increase in the oscillation amplitude, the removal of the tail current source that serves as the noise source, and the reduction of the distortion of the oscillation waveform without deteriorating the Q-factor of the resonator, thereby achieving an oscillator that has a low phase noise characteristic.

Sixth Embodiment

Figure 17:
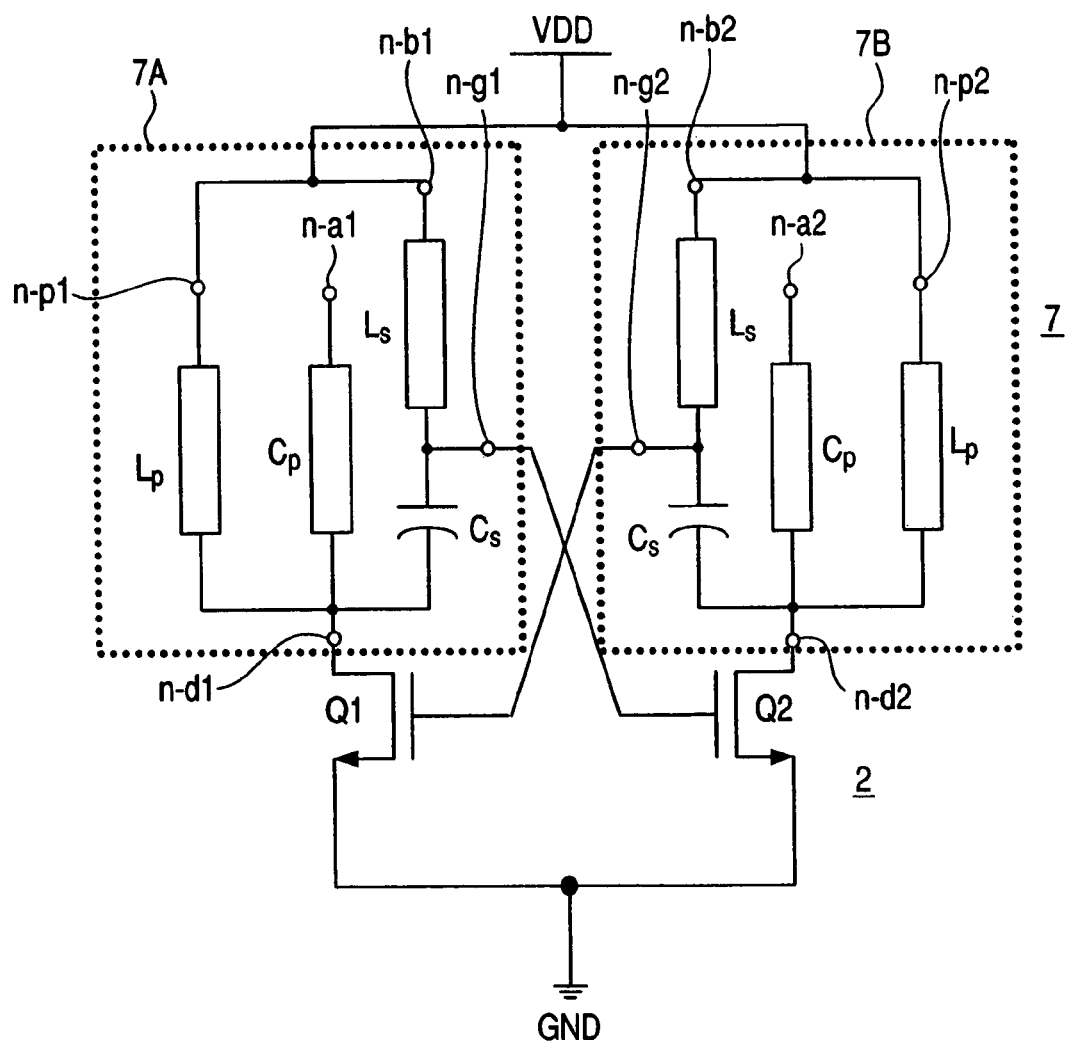
FIG. 17 is a circuit diagram showing a circuit configuration of an oscillator according to a sixth embodiment of the invention.
Figure 19:
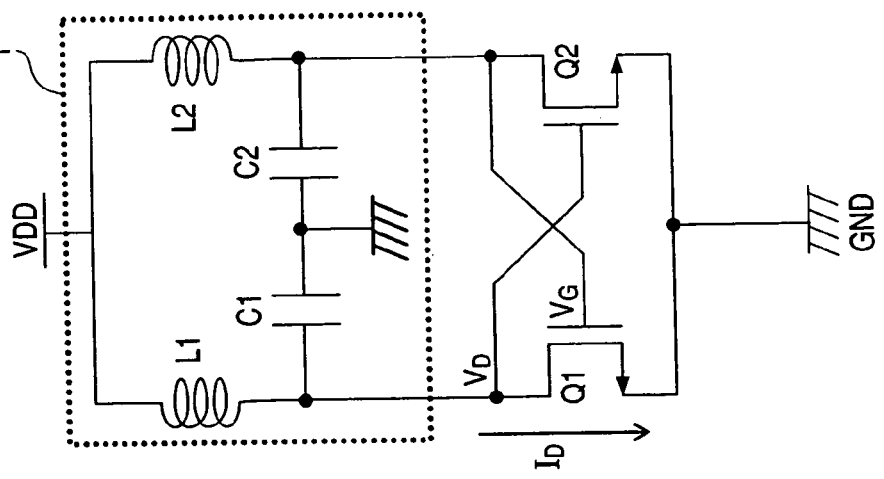
FIG. 19 is a circuit diagram showing an oscillator according to a second related art.
Figure 18:
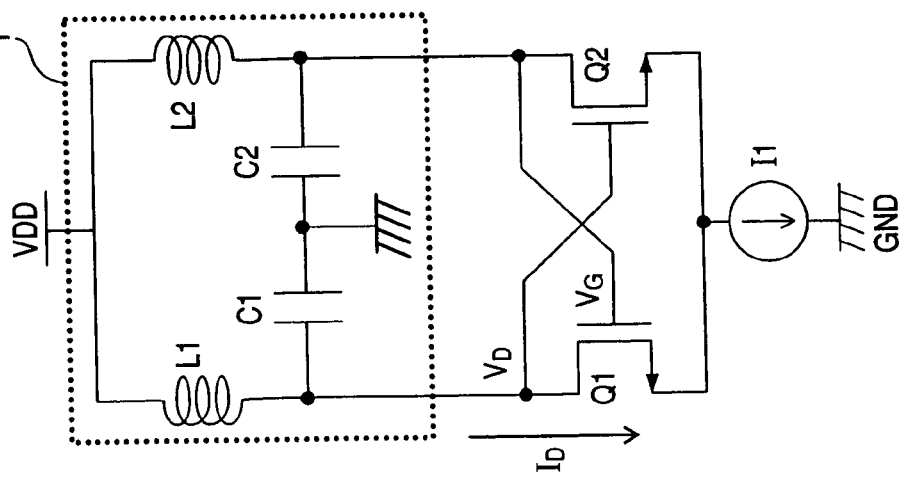
FIG. 18 is a circuit diagram showing an oscillator according to a first related (prior) art.
Figure 20:
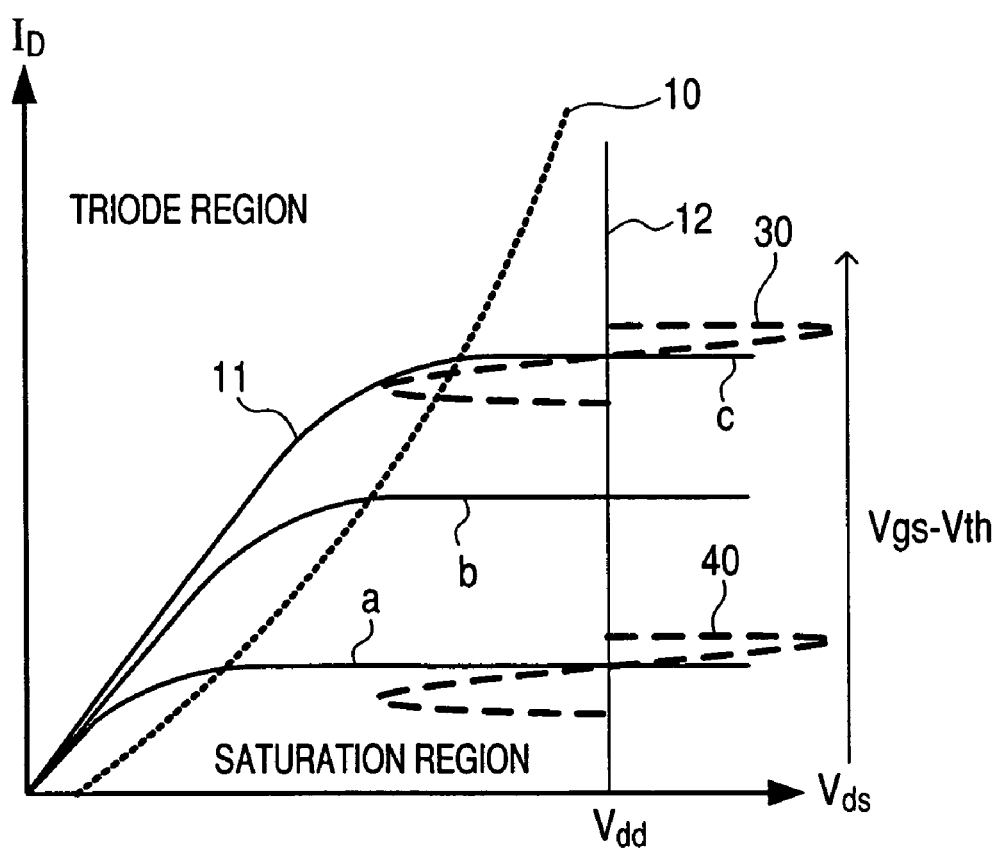
FIG. 20 is a diagram showing a correspondence between a gate-drain voltage and a drain current in the oscillator according to the second related art.
Figure 21:
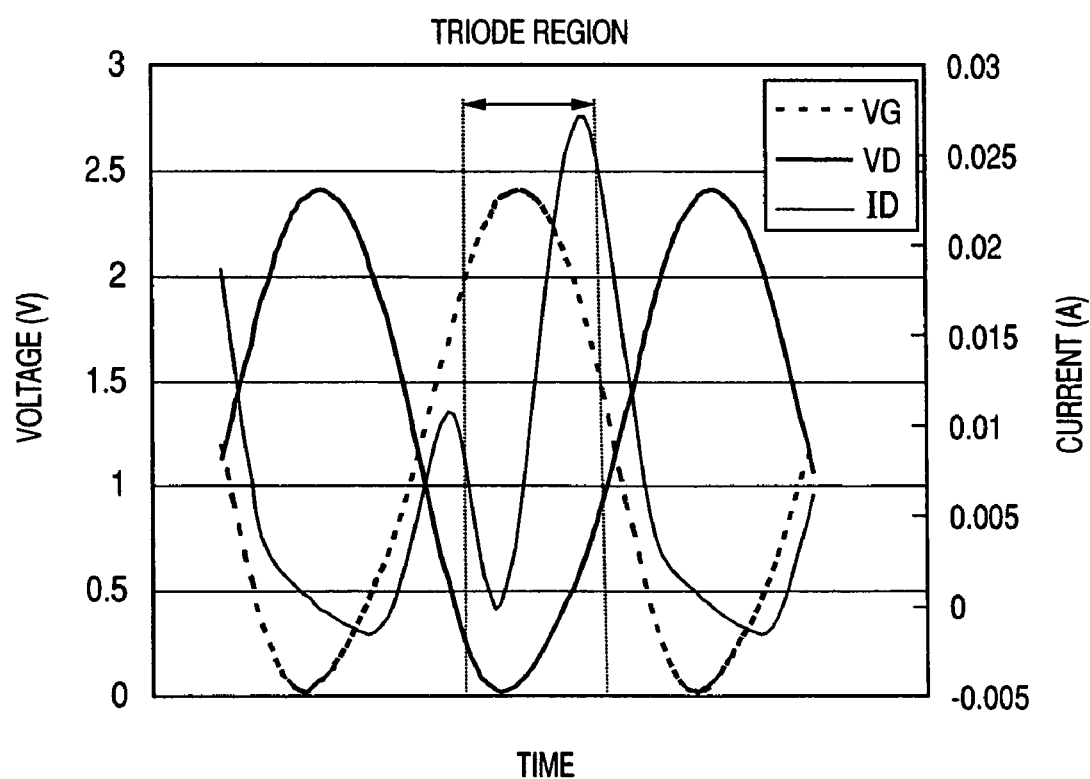
FIG. 21 is a diagram showing transient voltage waveforms of a gate terminal and a drain terminal and a transient waveform of a drain current in the oscillator shown in FIG. 19.
Figure 23:
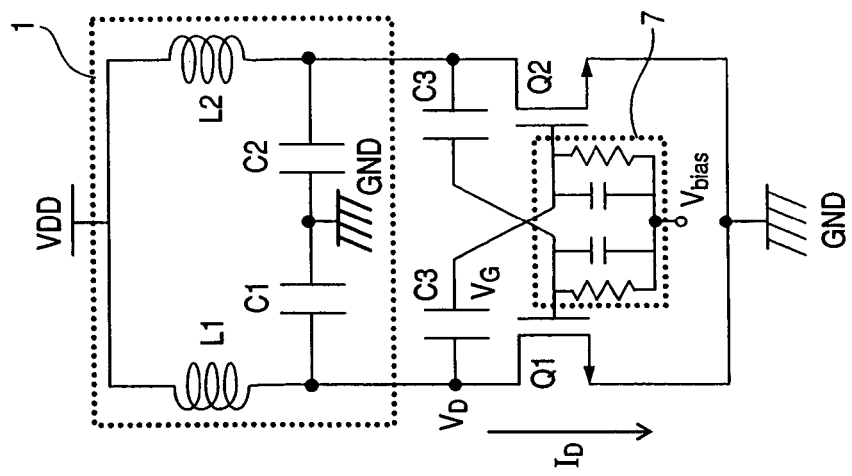
FIG. 23 is a circuit diagram showing an oscillator according to a fourth related art.
Figure 22:
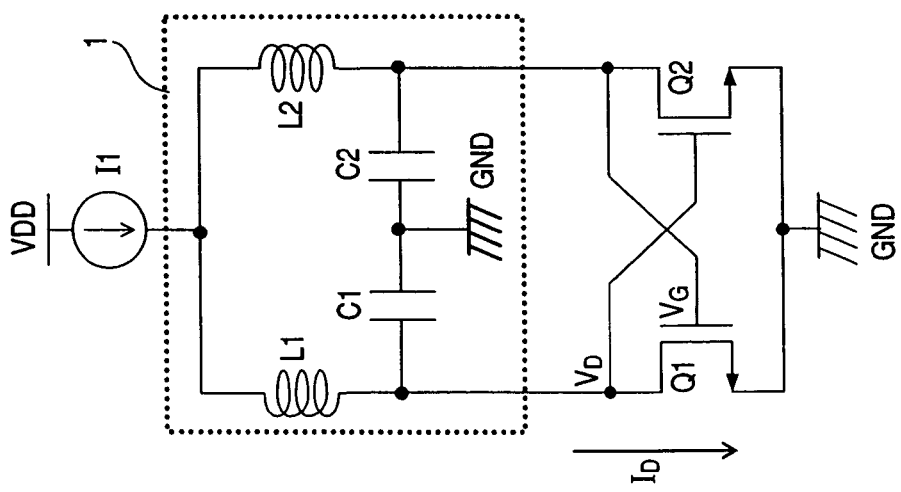
FIG. 22 is a circuit diagram showing an oscillator according to a third related art.

FIG. 17 is a circuit diagram showing an oscillator according to a sixth embodiment of the invention. The capacitors and the inductors that compose the resonator according to the sixth embodiment are configured by open stubs and short stubs that are installed in transmission lines such as a microstrip line or a coplanar waveguide of elements of the resonator. Resonators 7 (7A, 7B) include a parallel resonator unit that includes input terminals n-d1 and n-d2, output terminals n-g1 and n-g2 that drives a differential amplifier using a voltage, an inductor Lp and a capacitor Cp connected between the input and output terminals, and a serial resonator unit that includes a capacitor Cs and an inductor Ls arranged in this order as seen from the input terminals n-d1 and n-d2. The central point of the capacitor Cs and the inductor Ls of the series resonator unit serves as an output terminal. The resonators 7A and 7B further includes power supply direct connection terminals n-p1 and n-p2 that are directly connected to the power supply VDD, other connection terminals n-b1 and n-b2 that are connected to the power supply Vdd, and connection terminals n-a1 and n-a2 such as power supply that are connected to an alternating ground point.

The oscillator according to the sixth embodiment has a feedback loop that connects an output of one of transistors (for example, transistor Q1) that composes the differential amplifier 2 to the input terminal (for example, input terminal n-d1) of one of the resonators (for example, resonator 7A), and inputs the output terminal (for example, n-g1) of the resonator to the other transistor (for example, transistor Q2) of the differential amplifier.

Further, the inductors Lp and Ls can be achieved by a short stub with a transmission line of the length of λ/4 or less. Furthermore, the capacitor Cp can be achieved by an open stub with a transmission line of the length of λ/4 or less. The capacitor and the inductor may be configured by using a parasitic element that is caused in elements such as a transistor, between elements, or circuit wiring lines.

The oscillator according to the sixth embodiment is configured such that a transfer impedance from the input terminals n-d1 and n-d2 of the resonator 7 to the output terminals n-g1 and n-g2 of the resonator 7 is larger than a driving-point impedance of the input terminals n-d1 and n-d2 at an oscillation frequency. In this case, the input terminals n-d1 and n-d2 of the resonator 7 are connected with the drain terminals of the transistors Q1 and Q2 that serve as an output of the differential amplifier 2, and the output terminals n-g1 and n-g2 of the resonator 7 are connected with the inputs of differential amplifier 2 (gate terminals of the transistors Q1 and Q2). Further, in order to remove the tail current source (or top current source) that serves as a noise source, the power supply direct connection terminals n-p1 and n-p2 that are directly connected to the power supply VDD without interposing the tail current source therebetween are provided as an element for directly connecting the inductor Lp of the parallel resonator unit to the power supply.

Therefore, according to the sixth embodiment, it is possible to simultaneously satisfy the increase in the oscillation amplitude, the removal of the noise source, and the reduction of the distortion of the oscillation waveform without deteriorating the Q-factor of the resonator, thereby achieving an oscillator that has a low phase noise characteristic.

Seventh Embodiment

The LC cross-coupled oscillator according to the above embodiments is suitable for an oscillator of a transmitter circuit or a receiver circuit in a communication system that includes a transmitter, a receiver, a baseband circuit, and an antenna. Specifically, by integrating a transmitter or a receiver that includes an oscillator having a resonator with a mutual inductance M that has a negative polarity of the inductor Lp of the parallel resonator unit and the inductor Ls of the series resonator unit in an IC chip, it is possible to achieve low power consumption and low cost of a communication system with a reduced size. It is further possible to improve the communication distance by better low phase noise characteristic (specifically, in a millimeter wave band).

What is claimed is:

1. An oscillator comprising:
   a differential amplifier that includes a pair of transistors commonly grounded; and
   a pair of resonators each of which includes a first terminal, a second terminal, and a third terminal,
   wherein each of the resonators is configured by a feedback loop in which the first terminal, is connected to an output terminal of one of the transistors of the differential amplifier, and the second terminal is connected to an input terminal of the other transistor of the differential amplifier,
   wherein, in each of the resonators, a transfer impedance from the first terminal connected to the output terminal of the one transistor to the second terminal connected to the input terminal of the other transistor is larger than a driving-point impedance of the first terminal at an oscillation frequency, wherein each resonator includes, between the first terminal and a power supply terminal, a parallel resonator unit in which an inductor and a capacitor are connected in parallel and a series resonator unit in which an inductor and a capacitor are connected in series, wherein a central point of the inductor and the capacitor of the series resonator unit of each resonator is configured as the second terminal of the resonator, and wherein each resonator includes the series resonator unit in which the inductor and the capacitor are connected in series in this order as seen from the first terminal, between the first terminal and the power supply terminal.

2. The oscillator according to claim 1, wherein terminals of the differential amplifier that are commonly grounded are directly connected to a ground terminal.

3. The oscillator according to claim 1, wherein the third terminal of each resonator is directly connected to the power supply terminal.

4. The oscillator according to claim 1, wherein one of the first terminal and the second terminal of each resonator is configured to be an output terminal.

5. The oscillator according to claim 1, wherein each resonator includes a power supply connection terminal that directly connects the inductor of the parallel resonator unit to the power supply, as the third terminal.

6. The oscillator according to claim 1, wherein the inductor of the series resonator unit and the inductor of the parallel resonator unit of each resonator are mutually inductively connected.

7. The oscillator according to claim 6, wherein a mutual inductance of the inductor of the series resonator unit and the inductor of the parallel resonator unit is negative.

8. The oscillator according to claim 6, wherein the inductor of the series resonator unit of one of the resonators is connected to a drain terminal having a reversed phase of the differential amplifier, and wherein the inductor of the series resonator unit is positively magnetically coupled to the inductor of the parallel resonator unit of the other resonator.

9. An oscillator comprising:
a differential amplifier that includes a pair of transistors commonly grounded; and
a pair of resonators each of which includes a first terminal, a second terminal, and a third terminal,
wherein each of the resonators is configured by a feedback loop in which the first terminal is connected to an output terminal of one of the transistors of the differential amplifier, and the second terminal is connected to an input terminal of the other transistor of the differential amplifier,
wherein, in each of the resonators, a transfer impedance from the first terminal connected to the output terminal of the one transistor to the second terminal connected to the input terminal of the other transistor is larger than a driving-point impedance of the first terminal at an oscillation frequency,
wherein each resonator includes, between the first terminal and a power supply terminal, a parallel resonator unit in which an inductor and a capacitor are connected in parallel and a series resonator unit in which an inductor and a capacitor are connected in series, wherein the inductor of the series resonator unit and the inductor of the parallel resonator unit are configured as differential inductors, wherein a central point of the inductor and the capacitor of the series resonator unit of each resonator is connected to the input terminal of the pair of transistors, wherein the central point of the inductor of the parallel resonator unit of each resonator is connected to the power supply terminal, and wherein each resonator includes the series resonator unit in which the inductor and the capacitor are connected in series in this order as seen from the first terminal, between the first terminal and the power supply terminal.

10. An oscillator comprising:
a differential amplifier that includes a pair of transistors commonly grounded; and
a pair of resonators each of which includes a first terminal, a second terminal, and a third terminal,
wherein each of the resonators is configured by a feedback loop in which the third terminal is connected to a power supply terminal, the first terminal is connected to an output terminal of one of the transistors of the differential amplifier, and the second terminal is connected to an input terminal of the other transistor of the differential amplifier,
wherein each of the resonators comprises, between the first terminal and the power supply terminal:
a parallel resonator unit in which an inductor and a capacitor are connected in parallel; and
a series resonator unit in which an inductor and a capacitor are connected in series;
wherein terminals of the differential amplifier that are commonly grounded are connected to a ground terminal,
wherein a central point of the inductor and the capacitor of the series resonator unit of each resonator is configured as the second terminal of the resonator, and
wherein each resonator includes the series resonator unit in which the inductor and the capacitor are connected in series in this order as seen from the first terminal, between the first terminal and the power supply terminal.

11. The oscillator according to claim 10, wherein the inductor of the series resonator unit and the inductor of the parallel resonator unit of each resonator are mutually inductively connected.

12. The oscillator according to claim 11, wherein the capacitor and the inductor are configured by an open stub and a short stub that compose a transmission line of the resonators.

13. The oscillator according to claim 11, wherein the differential amplifier and the resonators are formed in an IC chip, and wherein the inductor of the series resonator unit and the inductor of the parallel resonator unit that are mutually inductively coupled are arranged in the same area of the IC chip.

14. The oscillator according to claim 11, wherein, in each of the resonators, a transfer impedance from the first terminal connected to the output terminal of the one transistor to the second terminal connected to the input terminal of the other transistor is larger than a driving-point impedance of the first terminal at an oscillation frequency.

15. A communication system comprising:
a transmitter circuit;
a receiver circuit;
a baseband circuit; and an antenna, wherein at least one of the transmitter circuit and the receiver circuit includes an oscillator, wherein the oscillator comprises:

a differential amplifier that includes a pair of transistors commonly grounded; and a pair of resonators that includes a first terminal, a second terminal, and a third terminal, wherein each of the resonators is configured by a feedback loop in which the third terminal is connected to a power supply terminal, the first terminal is connected to an output terminal of one of the transistors of the differential amplifier, and the second terminal is connected to an input terminal of the other transistor of the differential amplifier, wherein, in each of resonators, a transfer impedance from the first terminal connected to the output terminal of the one transistor to the second terminal connected to the input terminal of the other transistor is larger than a driving-point impedance of the first terminal at an oscillation frequency, wherein terminals of the differential amplifier that are commonly grounded are connected to the ground terminal, wherein each resonator includes, between the first terminal and a power supply terminal, a parallel resonator unit in which an inductor and a capacitor are connected in parallel and a series resonator unit in which an inductor and a capacitor are connected in series, wherein a central point of the inductor and the capacitor of the series resonator unit of each resonator is configured as the second terminal of the resonator, and wherein each resonator includes the series resonator unit in which the inductor and the capacitor are connected in series in this order as seen from the first terminal, between the first terminal and the power supply terminal.

16. The communication system according to claim 15, wherein the differential amplifier and the resonators are formed in an IC chip, and wherein the inductor of the series resonator unit and the inductor of the parallel resonator unit that are mutually inductively coupled are arranged in the same area of the IC chip.

* * * * *